(12) United States Patent
Tsuno et al.

(10) Patent No.: US 10,217,777 B2
(45) Date of Patent: Feb. 26, 2019

(54) DISPLAY DEVICE, SEMICONDUCTOR DEVICE, AND METHOD OF MANUFACTURING DISPLAY DEVICE

(71) Applicant: Sony Corporation, Tokyo (JP)

(72) Inventors: Hitoshi Tsuno, Tokyo (JP); Koichi Nagasawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/794,228

(22) Filed: Oct. 26, 2017

(65) Prior Publication Data

US 2018/0047761 A1 Feb. 15, 2018

Related U.S. Application Data

(63) Continuation of application No. 15/332,137, filed on Oct. 24, 2016, which is a continuation of application
(Continued)

(30) Foreign Application Priority Data

Jun. 15, 2012 (JP) .................................. 2012-135458
Mar. 8, 2013 (JP) .................................. 2013-046895

(51) Int. Cl.
*H01L 27/108* (2006.01)
*H01L 27/12* (2006.01)
*H01L 27/32* (2006.01)

(52) U.S. Cl.
CPC ........ *H01L 27/1255* (2013.01); *H01L 27/124* (2013.01); *H01L 27/1262* (2013.01); *H01L 27/3265* (2013.01)

(58) Field of Classification Search
CPC H01L 27/1255; H01L 27/124; H01L 27/1262
(Continued)

(56) References Cited

U.S. PATENT DOCUMENTS 7,330,168 B2* 2/2008 Anzai ................ H01L 27/3265
                                                    257/E27.111
9,508,758 B2 11/2016 Tsuno
(Continued)

FOREIGN PATENT DOCUMENTS

JP    2001-066631    3/2001
JP    2001-282137    10/2001
(Continued)

OTHER PUBLICATIONS

International Search Report for PCT Application No. PCT/JP2013/063494, dated Jul. 24, 2013, 4 pages.
(Continued)

*Primary Examiner* — Tan N Tran
(74) *Attorney, Agent, or Firm* — K&L Gates LLP

(57) ABSTRACT

A display device according to the present disclosure includes: a transistor section (100) that includes a gate insulating film (130), a semiconductor layer (140), and a gate electrode layer (120), the semiconductor layer being laminated on the gate insulating film, the gate electrode film being laminated on an opposite side to the semiconductor layer of the gate insulating film; a first capacitor section (200) that includes a first metal film (210) and a second metal film (220), the first metal film being disposed at a same level as wiring layers (161, 162) that are electrically connected to the semiconductor layer and is disposed over the transistor section, the second metal film being disposed over the first metal film with a first interlayer insulating film (152) in between; and a display element that is configured to be controlled by the transistor section.

34 Claims, 40 Drawing Sheets

Related U.S. Application Data

No. 14/405,859, filed as application No. PCT/JP2013/063494 on May 15, 2013, now Pat. No. 9,508,758.

(58) Field of Classification Search
USPC .................. 257/296, 298, 303, 306, 307
See application file for complete search history.

(56) References Cited

U.S. PATENT DOCUMENTS

| | | |
|---|---|---|
| 2002/0071072 A1 | 6/2002 | Ohtani et al. |
| 2006/0076560 A1 | 4/2006 | Eguchi et al. |
| 2008/0265254 A1 | 10/2008 | Nishiura |

FOREIGN PATENT DOCUMENTS

| | | |
|---|---|---|
| JP | 2003-323133 | 11/2003 |
| JP | 2005-183509 | 7/2005 |
| JP | 2008-102262 | 5/2008 |
| JP | 2008-286905 | 11/2008 |
| JP | 2011-228622 | 11/2011 |

OTHER PUBLICATIONS

Japanese Office Action dated Mar. 28, 2017 in corresponding Japanese Application No. 2014-521212.

\* cited by examiner

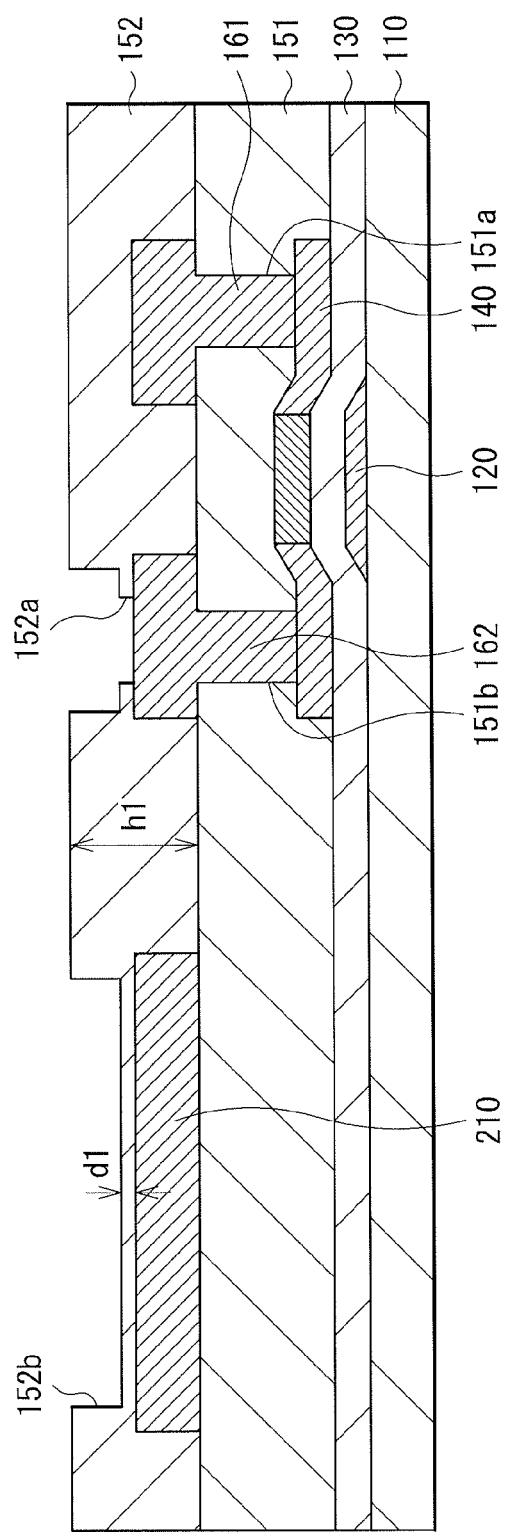

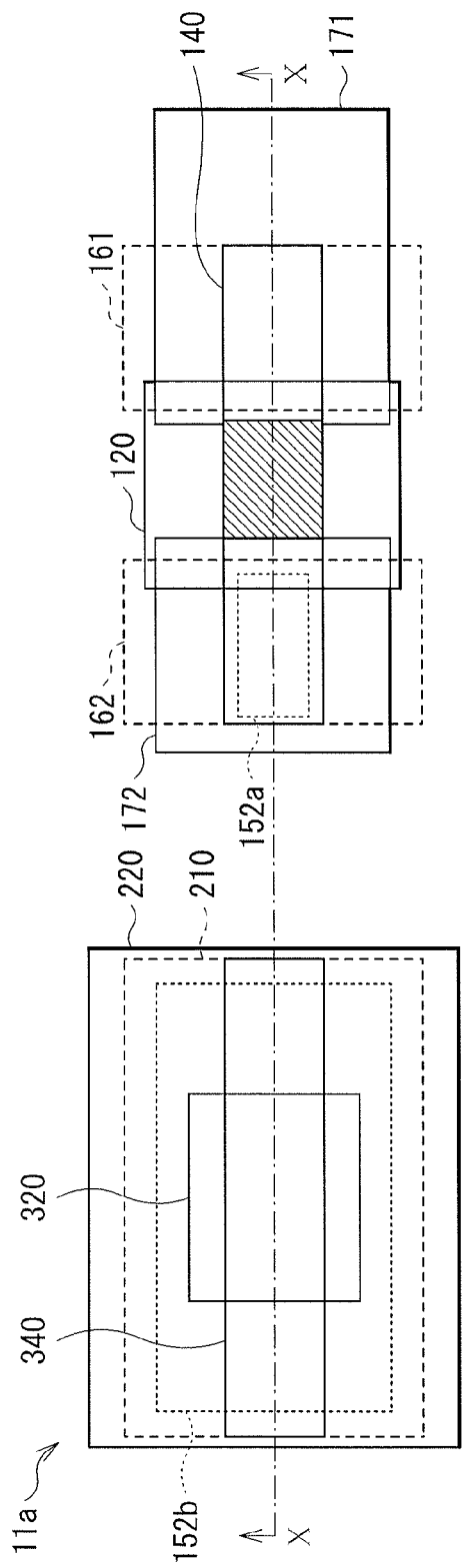

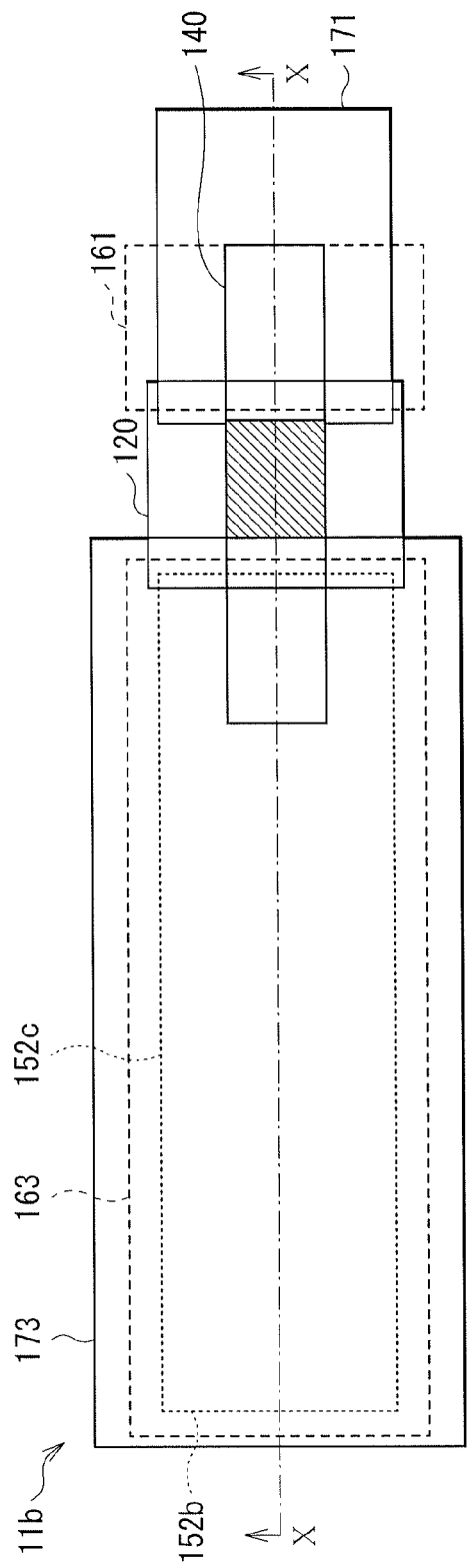

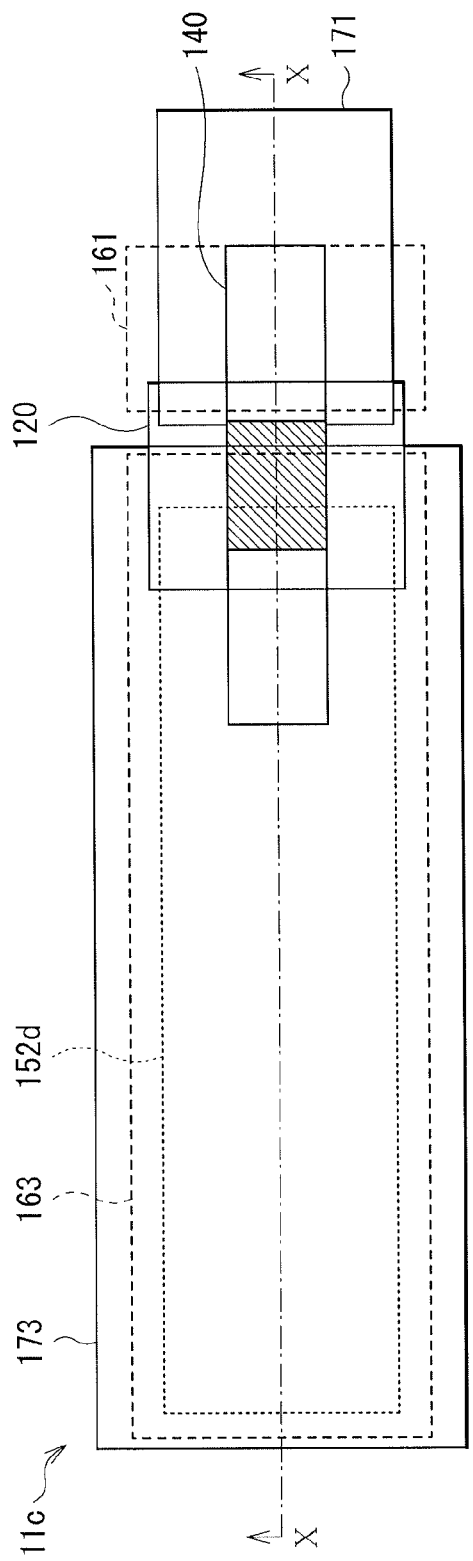

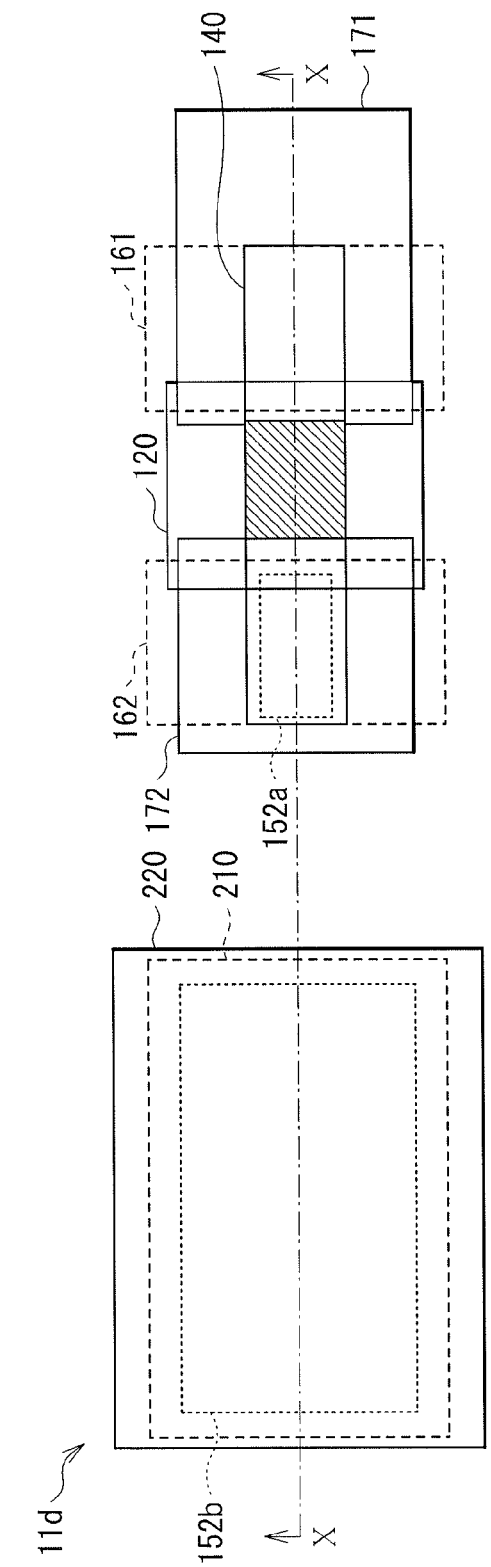

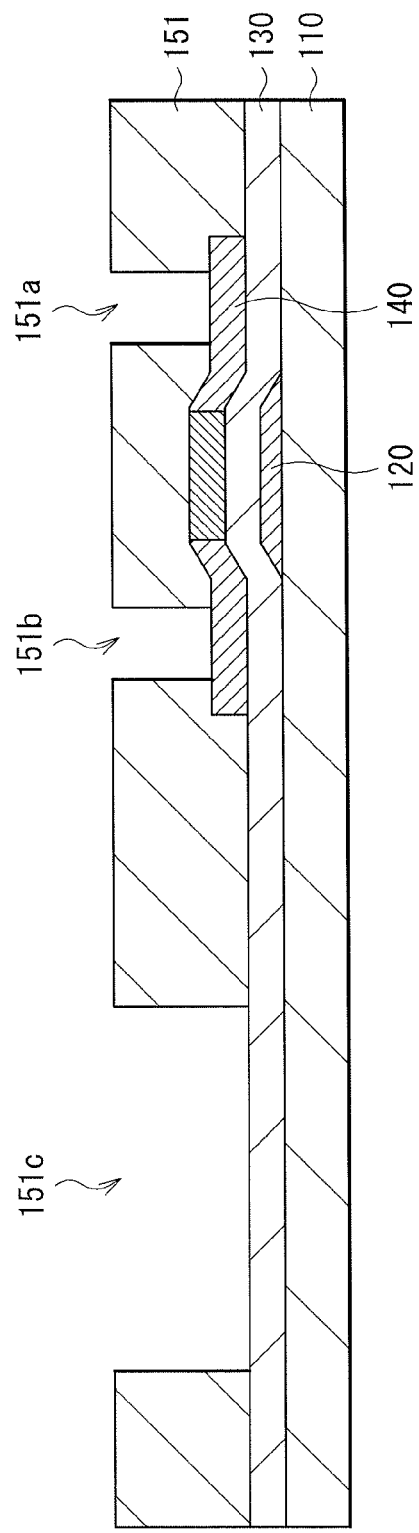

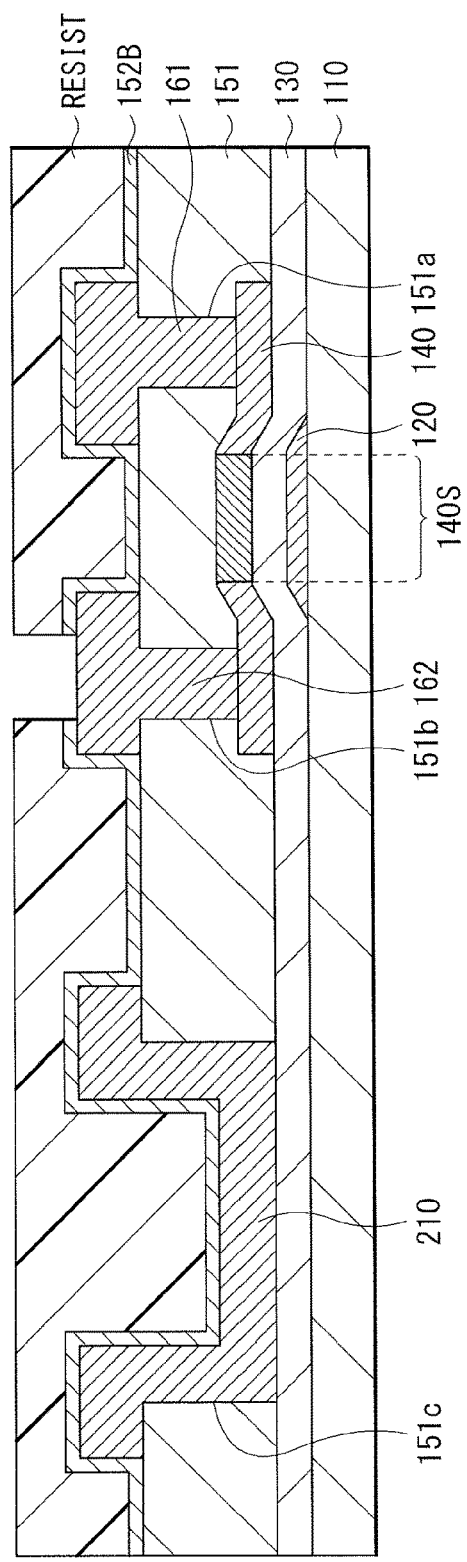

DISPLAY DEVICE, SEMICONDUCTOR DEVICE, AND METHOD OF MANUFACTURING DISPLAY DEVICE

CROSS REFERENCES TO RELATED APPLICATIONS

The present application is a continuation application of U.S. patent application Ser. No. 15/332,137, filed on Oct. 24, 2016, which application is a continuation of U.S. patent application Ser. No. 14/405,859, filed Dec. 5, 2014, issued as U.S. Pat. No. 9,508,758 on Nov. 29, 2016, which is a National Stage entry of PCT/JP2013/063494 filed on May 15, 2013, which claims the priority from prior Japanese Priority Patent Application JP 2013-046895 filed on Mar. 8, 2013, and Japanese Priority Patent Application JP 2012-135458 filed on Jun. 15, 2012, the entire content of which is hereby incorporated by reference.

BACKGROUND ART

In a flat panel display such as a liquid crystal display or an organic EL (Electro-Luminescence) display, an active matrix thin film transistor (TFT) has been widely used for a drive transistor that drives a panel. Each pixel is provided with such a TFT to make it possible to control brightness and darkness of each pixel, attaining higher image quality and higher contrast compared to a passive matrix method.

Moreover, in such a flat panel display, further improvement in performance is being pursued. For example, there has been proposed a technique in which a gate insulating film of a TFT and a dielectric film of a capacitor are fabricated in different layers to allow selection of an optimum dielectric film without restrictions by TFT materials (For example, see Patent Literature 1). Such a dielectric film allows, for example, selection of a material having a higher dielectric constant than that of the gate insulating film, or allows smaller thickness for the same material as the gate insulating film, leading to enhanced capacity per unit area.

PATENT LITERATURE

PTL 1: JP 2008-102262A

SUMMARY OF INVENTION

The present disclosure relates to a display device, a semiconductor device, and a method of manufacturing a display device.

However, in Patent Literature 1, a metal film in the same layer as the gate electrode is used for one electrode of the capacitor, causing a disadvantage of preventing improvement in performance of the thin film transistor due to restrictions by an arrangement or materials of the capacitor.

It is therefore desirable to provide a display device, a semiconductor device, and a method of manufacturing a display device that make it possible to improve performance.

A display device according to an embodiment of the present technology includes: a transistor section that includes a gate insulating film, a semiconductor layer, and a gate electrode layer, the semiconductor layer being laminated on the gate insulating film, the gate electrode film being laminated on an opposite side to the semiconductor layer of the gate insulating film; a first capacitor section that includes a first metal film and a second metal film, the first metal film being disposed at a same level as a wiring layer that is electrically connected to the semiconductor layer and is disposed over the transistor section, the second metal film being disposed over the first metal film with a first interlayer insulating film in between; and a display element that is configured to be driven by the transistor section.

A semiconductor device according to an embodiment of the present technology includes a transistor section and a capacitor section, and the transistor section and the capacitor section have similar configurations to those of the transistor section and the first capacitor section of the above-described display device.

A method of manufacturing a display device according to an embodiment of the present technology includes the following (A) to (C).

(A) forming a transistor section by laminating a gate electrode, a gate insulating film, and a semiconductor layer (B) forming a first capacitor section by depositing, over the transistor section, a wiring layer and a first metal film, and by depositing, over the first metal film, a second metal film with a first interlayer insulating film in between, the wiring layer being electrically connected to the semiconductor layer, the first metal film being at a same level as the wiring layer (C) forming a display element that is configured to be controlled by the transistor section In the display device, the semiconductor device, and the method of manufacturing the display device according to the above-described embodiments of the present technology, the metal film that constitutes the capacitor (the first capacitor section) is provided in a different layer from the transistor section. This provides a greater degree of selection of materials of the capacitor.

According to the display device, the semiconductor device, and the method of manufacturing the display device in the above-described embodiments, the metal film that constitutes the capacitor (the first capacitor section) is provided in a different layer from the transistor section. This provides a greater degree of selection of materials of the capacitor, contributing to reduction in resistance of the whole wiring. Hence, it is possible to provide a high-performance display device.

Additional features and advantages are described herein, and will be apparent from the following Detailed Description and the figures.

BRIEF DESCRIPTION OF DRAWINGS

FIG. 5A is a cross-sectional view illustrating a process following FIG. 4B.

FIG. 6A is a plan view illustrating a configuration of a TFT and a capacitor according to a second embodiment.

FIG. 7A is a plan view illustrating a configuration of a TFT and a capacitor according to a third embodiment.

FIG. 8A is a plan view illustrating another configuration of the TFT and the capacitor according to the third embodiment.

FIG. 9A is a plan view illustrating a configuration of a TFT and a capacitor according to a fourth embodiment.

FIG. 14A is a cross-sectional view illustrating a manufacturing process of the TFT and the capacitor illustrated in FIG. 13B.

FIG. 14B is a cross-sectional view illustrating a process following FIG. 14A.

DETAILED DESCRIPTION

Embodiments of the present application will be described below in detail with reference to the drawings. It is to be noted that description will be made in the following order.
1. First Embodiment (an example in which a first capacitor is provided in a different layer from a transistor section)
2. Second Embodiment (an example in which a second capacitor is provided below the first capacitor)
3. Third Embodiment (an example in which one metal film of the first capacitor is shared with a wiring layer of the transistor section)
4. Fourth Embodiment (an example with use of an interlayer insulating film having a layered structure)
5. Fifth Embodiment (an example with a transistor section of a top gate type)
6. Sixth Embodiment (a first example in which the first capacitor has a recessed portion)
7. Modification Example 1 (a second example in which the first capacitor has the recessed portion)
8. Seventh Embodiment (an example in which the second capacitor is provided below the first capacitor having the recessed portion)
9. Eighth Embodiment (a first example in which the first capacitor has a plurality of recessed portions)
10. Modification Example 2 (a second example in which the first capacitor has the plurality of recessed portions)
11. Application Examples

1. First Embodiment

Figure 1:
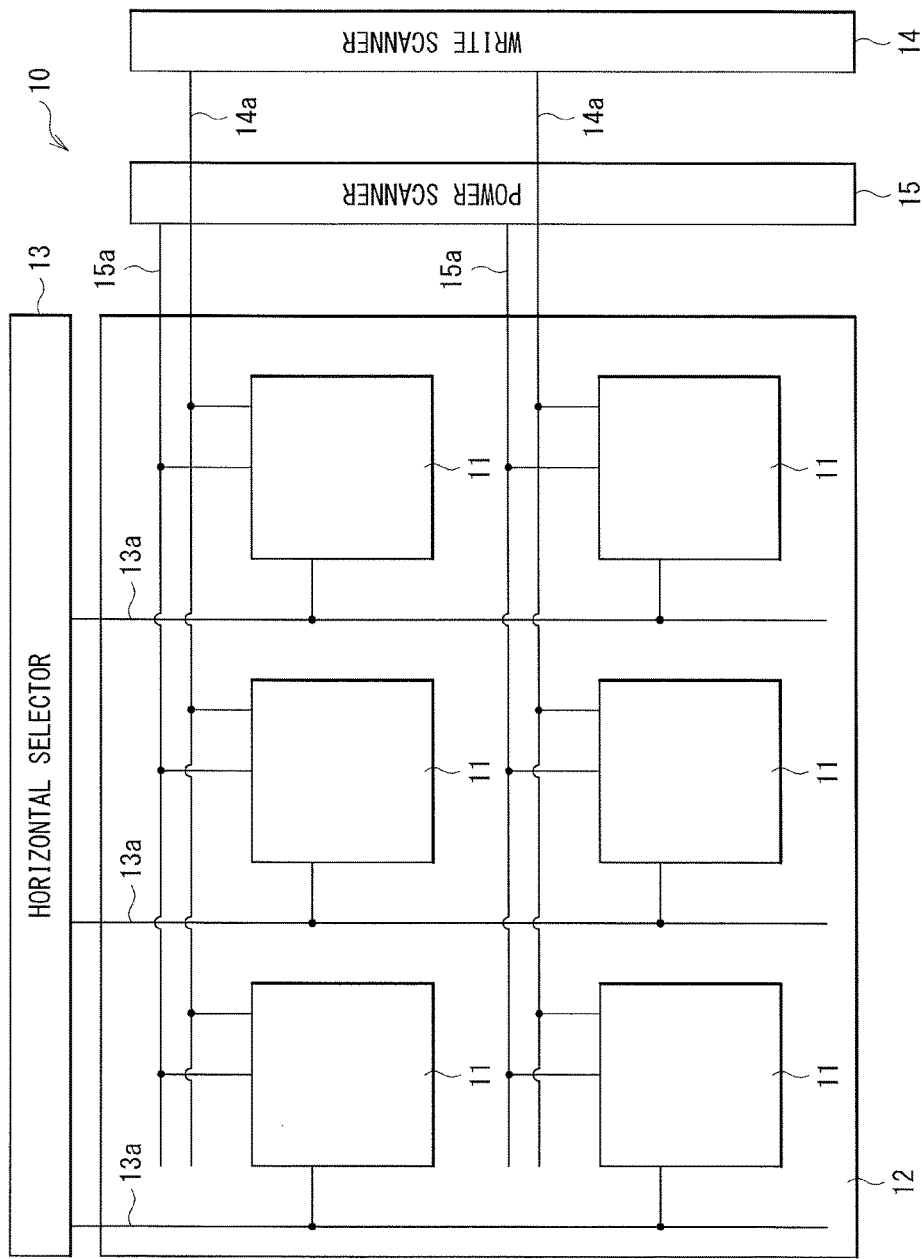
FIG. 1 is a diagram illustrating one configuration example of an organic EL display device.

As an example of a flat panel display (a display device), a case of an organic EL display will be exemplified. FIG. 1 illustrates a configuration of the organic EL display.

A display device 10, which is the organic EL display, includes a pixel array section 12 and a drive section (not illustrated) that drives the pixel array section 12. The pixel array section 12 includes scan lines 14a in rows, signal lines 13a in columns, pixels 11 in an array that are disposed at intersections of the scan lines 14a and the signal lines 13a, power lines 15a that are disposed in correspondence with the respective rows of the pixels 11. The drive section includes a horizontal selector 13, a write scanner 14, and a power scanner 15. The horizontal selector 13 is adapted to supply a signal potential as a picture signal and a reference potential to each of the signal lines 13a, to sequentially scan the pixels 11 in units of columns. The write scanner 14 is adapted to sequentially supply a control signal to each of the scan lines 14a in rows in accordance with the scanning by the horizontal selector 13, to sequentially scan the pixels 11 in units of rows. The power scanner 15 is adapted to supply a power voltage that is switched between a first potential and a second potential to each of the power lines 15a in accordance with the scanning by the write scanner 14.

Figure 2:
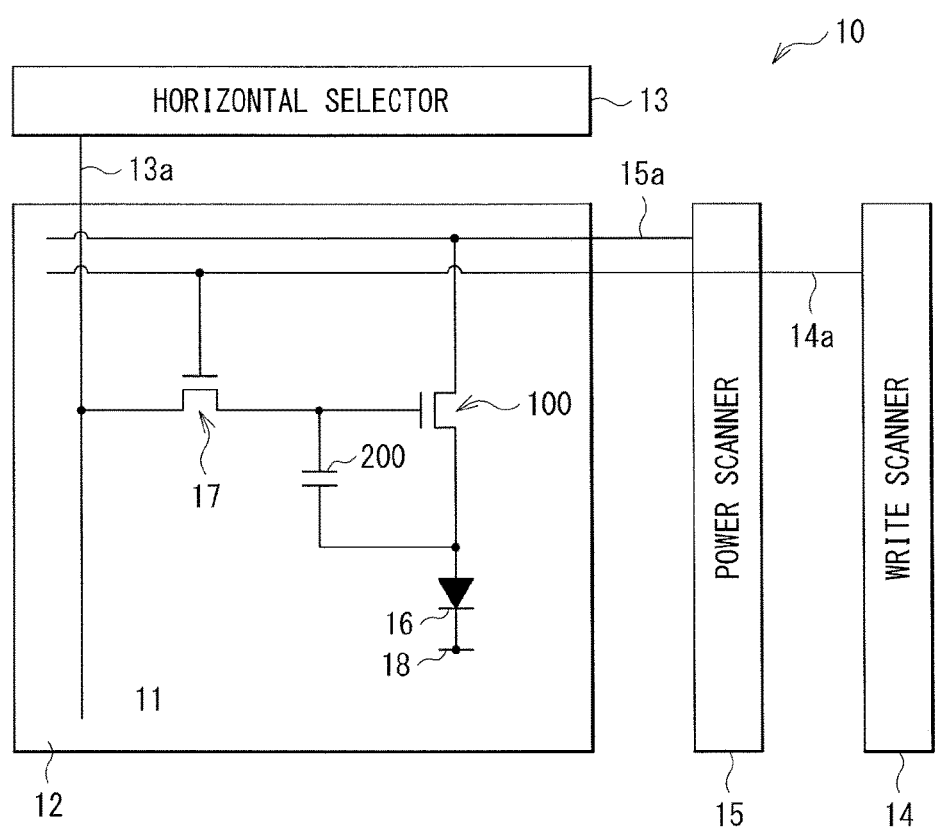
FIG. 2 is a diagram illustrating one example of a circuit configuration of the organic EL display device.

Next, description will be given, with reference to FIG. 2, on one example of a circuit configuration of the pixel 11 of the display device 10.

The pixel 11 includes a display element 16 typified by an organic EL device and the like, a sampling TFT 17, a driving TFT 100, and a capacitor 200. The sampling TFT 17 has a gate, a source, and a drain. The gate is connected to the associated scan line 14a. One of the source and the drain is connected to the associated signal line 13a, and another is connected to a gate of the driving TFT 100. The driving TFT 100 has the gate, a source, and a drain. The source is connected to an anode of the display element 16, and the drain is connected to the associated power line 15a. A cathode of the display element 16 is connected to a ground wiring 18. It is to be noted that the ground wiring 18 is wired commonly to all of the pixels 11. The capacitor 200 is connected between the source and the gate of the driving TFT 100.

In the pixel 11 as configured above, the sampling TFT 17 is adapted to become conductive in response to the control signal supplied from the scan line 14a, to sample the signal potential supplied from the signal line 13a, and to retain the signal potential thus sampled in the capacitor 200.

The driving TFT 100 is adapted to be supplied with a current from the power line 15a that is at the first potential, and to allow a drive current to flow through the display element 16 according to the signal potential retained by the capacitor 200. The power scanner 15 is adapted to switch the power line 15a between the first potential and the second potential while the horizontal selector 13 is supplying the reference potential to the signal line 13a after the sampling TFT 17 becomes conductive, and to allow the capacitor 200 to retain a voltage equivalent to a threshold voltage of the driving TFT 100. With this threshold voltage correction function, it is possible to restrain the display device 10 from being affected by variations in the threshold voltage of the driving TFTs 100 for each pixel 11.

Next, description will be given, with reference to FIG. 3A and FIG. 3B, on the TFT 100 (a transistor section) and the capacitor 200 (a first capacitor section) that constitute the pixel 11.

Figure 3A:
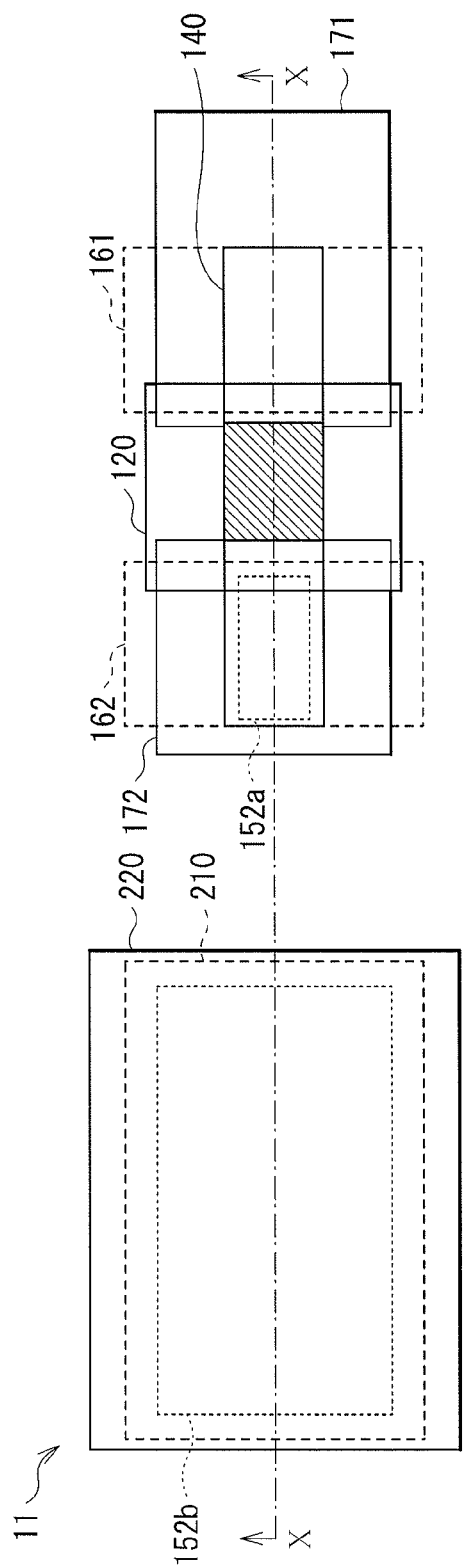
FIG. 3A is a plan view illustrating a configuration of a TFT and a capacitor according to a first embodiment.

FIG. 3A illustrates a plan configuration of the TFT 100 and the capacitor 200 of the pixel 11. FIG. 3B illustrates a cross-sectional configuration along a dot dash line X-X of the pixel 11 in FIG. 3A.

Figure 3B:
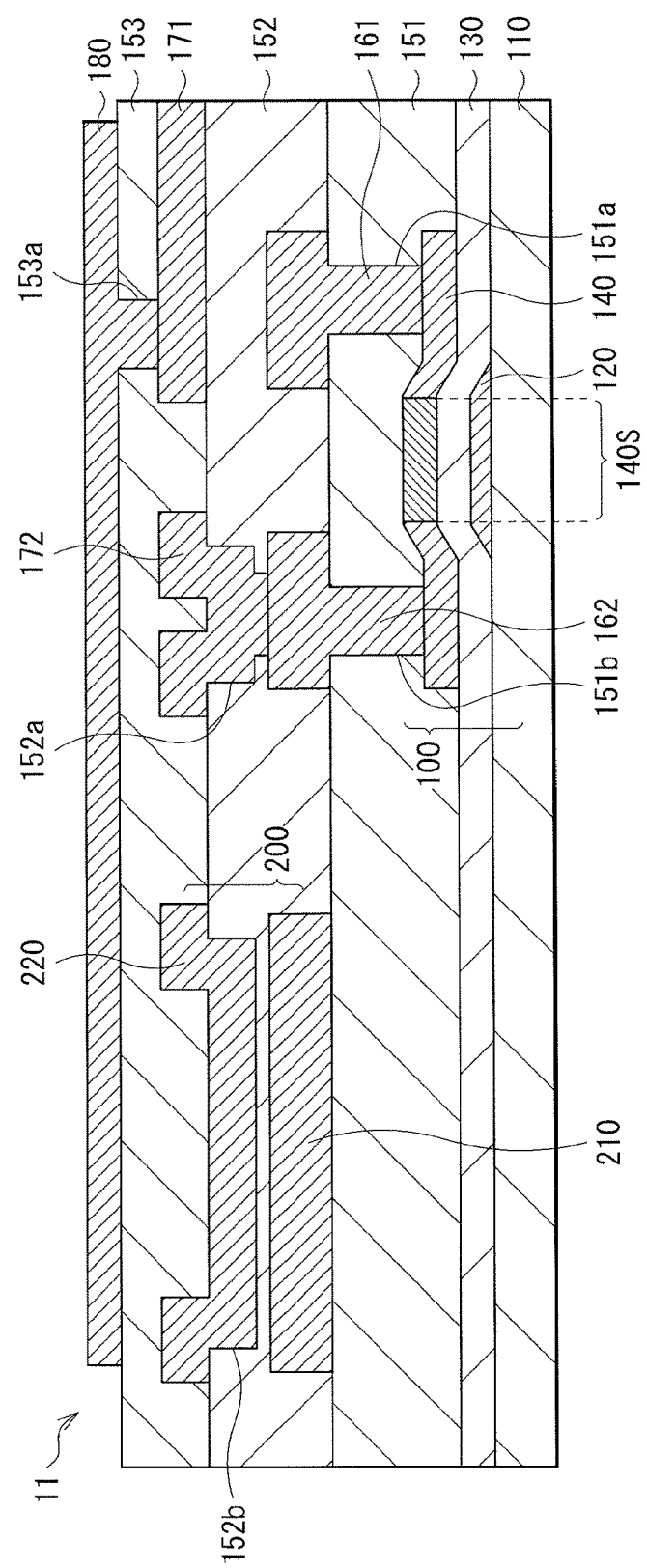
FIG. 3B is a cross-sectional view illustrating the configuration of the TFT and the capacitor illustrated in FIG. 3A.

The TFT 100 includes, as illustrated in FIG. 3B, on a glass substrate 110, a gate insulating film 130, a semiconductor layer 140, and a gate electrode film 120. The semiconductor layer 140 is laminated on the gate insulating film 130. The gate electrode film 120 is laminated on an opposite side to the semiconductor layer 140 of the gate insulating film 130. It is to be noted that the first embodiment exemplifies the TFT 100 of a bottom gate type, in which the gate electrode film 120, the gate insulating film 130, and the semiconductor layer 140 are laminated in this order on the glass substrate 110. The gate insulating film 130 is configured of, for example, silicon oxide, silicon nitride, or a lamination thereof. The semiconductor layer 140 is configured of, for example, polysilicon, amorphous silicon, or micro crystal silicon. Moreover, to the semiconductor layer 140, the following organic semiconductor materials may be applicable: pentacene, naphthacene, hexacene, heptacene, pyrene, chrycene, perylene, coronene, rubrene, polythiophene, polyacene, polyphenylene vinylene, polypyrrole, porphyrin, carbon nanotube, fullerene, metal phthalocyanine, or a derivative thereof. Alternatively, an oxide semiconductor may be applicable, which is configured of a compound that includes an element such as indium, gallium, zinc, tin, or the like and oxygen. More specifically, examples of amorphous oxide semiconductors include indium gallium zinc oxide, and examples of crystalline oxide semiconductors include zinc oxide, indium zinc oxide, indium gallium oxide, indium tin oxide, indium oxide, or the like.

While the TFT 100 is configured as described above, an interlayer insulating film 151 (a second interlayer insulating film) is provided on the semiconductor 140 and the gate insulating film 130. The interlayer insulating film 151 is provided with contact holes 151a and 151b at predetermined positions. On the interlayer insulating film 151, wiring layers 161 and 162 are formed. The wiring layers 161 and 162 are electrically connected to source and drain regions of the semiconductor layer 140 through the contact holes 151a and 151b.

On the interlayer insulating film 151, the wiring layers 161 and 162, and a metal film 210, the capacitor 200 is provided, as well as an interlayer insulating film 152 (a first interlayer insulating film). The capacitor 200 includes a pair of electrodes (metal films) 210 and 220. A dielectric film between the metal films 210 and 220 is configured of part of the interlayer insulating film 152. In the present embodiment, one metal film 210 of the capacitor 200 is disposed at a same level with the wiring layers 161 and 162. The metal film 220 is formed in a recessed portion 152b that is provided in the interlayer insulating film 152.

The interlayer insulating film 152 is provided with a wiring layer 171 and a contact hole 152a at predetermined positions, as well as the recessed portion 152b. A wiring layer 172 is formed in the contact hole 152a. It is to be noted that, as illustrated in FIG. 3A, the recessed portion 152b is formed in an inclusion relationship with the metal films 210 and 220.

On the interlayer insulating film 152, an interlayer insulating film 153 is further formed, covering the wiring layers 171 and 172, and the metal film 220. On the interlayer insulating film 153, a pixel electrode layer 180 is formed. The pixel electrode layer 180 is electrically connected to the wiring layer 171 through a contact hole 153a.

The wiring layers 161, 162, 171, and 172, and the metal films 210 and 220 may be configured of, for example, aluminum, tungsten, copper, titanium, or molybdenum, or an alloy that contains these elements as main components. The interlayer insulating films 151, 152, and 153 may be configured of, for example, silicon oxide, silicon nitride, polyimide, or an acrylic resin, or a lamination thereof.

Next, description will be given, with reference to FIG. 3 and FIGS. 4A to 5B, on a manufacturing method of the TFT 100 and the capacitor 200 that constitute the pixel 11. It is to be noted that a case of using polysilicon for the semiconductor layer will be described here, but an organic semiconductor, an oxide semiconductor or the like may be similarly adoptable.

Figure 4A:
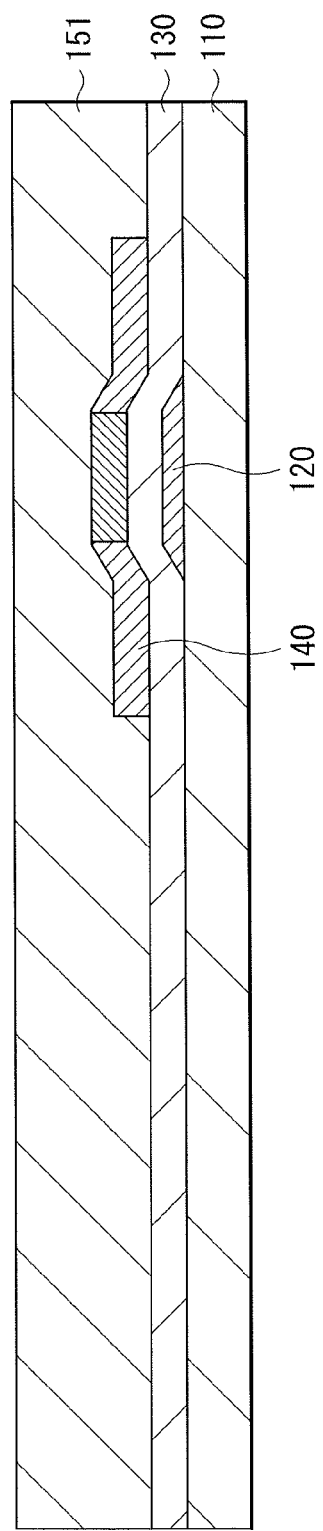
FIG. 4A is a cross-sectional view illustrating a manufacturing process of the TFT and the capacitor illustrated in FIG. 3B.

First, as illustrated in FIG. 4A, the TFT 100 and the interlayer insulating film 151 are formed. Specifically, on the glass substrate 110, a metal thin film is deposited by a sputtering method or the like, and then is patterned to form the gate electrode film 120. Subsequently, on the glass substrate 110 on which the gate electrode film 120 is formed, a film of, for example, silicon oxide, silicon nitride, or a lamination thereof is deposited by a CVD (Chemical Vapor Deposition) method to form the gate insulating film 130. Next, on the gate insulating film 130, for example, an amorphous silicon layer is deposited by a CVD method, and then is crystallized by ELA (Excimer Laser Annealing) or the like. On this occasion, a possible alternative is to directly deposit a polysilicon layer by a CVD method or the like. The amorphous silicon layer thus crystallized is subjected to implantation of impurities and activation at a predetermined portion, and then is patterned to form the semiconductor layer 140 (a channel region 140S). Covering the semiconductor layer 140 thus formed, on the gate insulating film 130, for example, silicon oxide is deposited by a CVD method to form the interlayer insulating film 151.

Figure 4B:
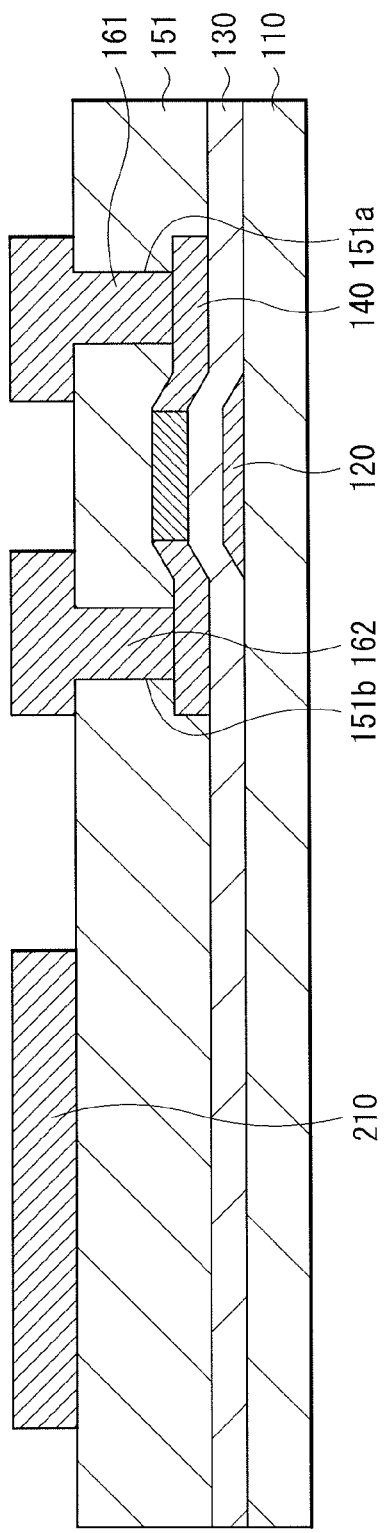
FIG. 4B is a cross-sectional view illustrating a process following FIG. 4A.

Subsequently, as illustrated in FIG. 4B, the wiring layers 161 and 162, and the metal film 210 are formed. Specifically, a metal film is deposited on the interlayer insulating film 151. On this occasion, the metal film is also deposited over the contact holes 151a and 151b, and then is patterned to form the wiring layers 161 and 162, and the metal film 210. It is to be noted that a film thickness of the metal film 210 may be, for example, about 100 to 1500 nm.

Next, as illustrated in FIG. 5A, the interlayer insulating film 152 is formed. Specifically, on the interlayer insulating film 151, for example, silicon oxide is deposited by a CVD method, covering the wiring layers 161 and 162, and the metal film 210. The silicon oxide is subjected to lithography and etching at a predetermined portion to form the interlayer insulating film 152 having the contact hole 152a that reaches the wiring layer 162, and the recessed portion 152b. It is to be noted that a film thickness d1 between a bottom of the recessed portion 152b formed in the interlayer insulating film 152 and an upper surface of the metal film 210 may be arbitrarily set. And a film thickness h1 of the interlayer insulating film 152 may be, for example, about 150 to 3000 nm.

Figure 5B:
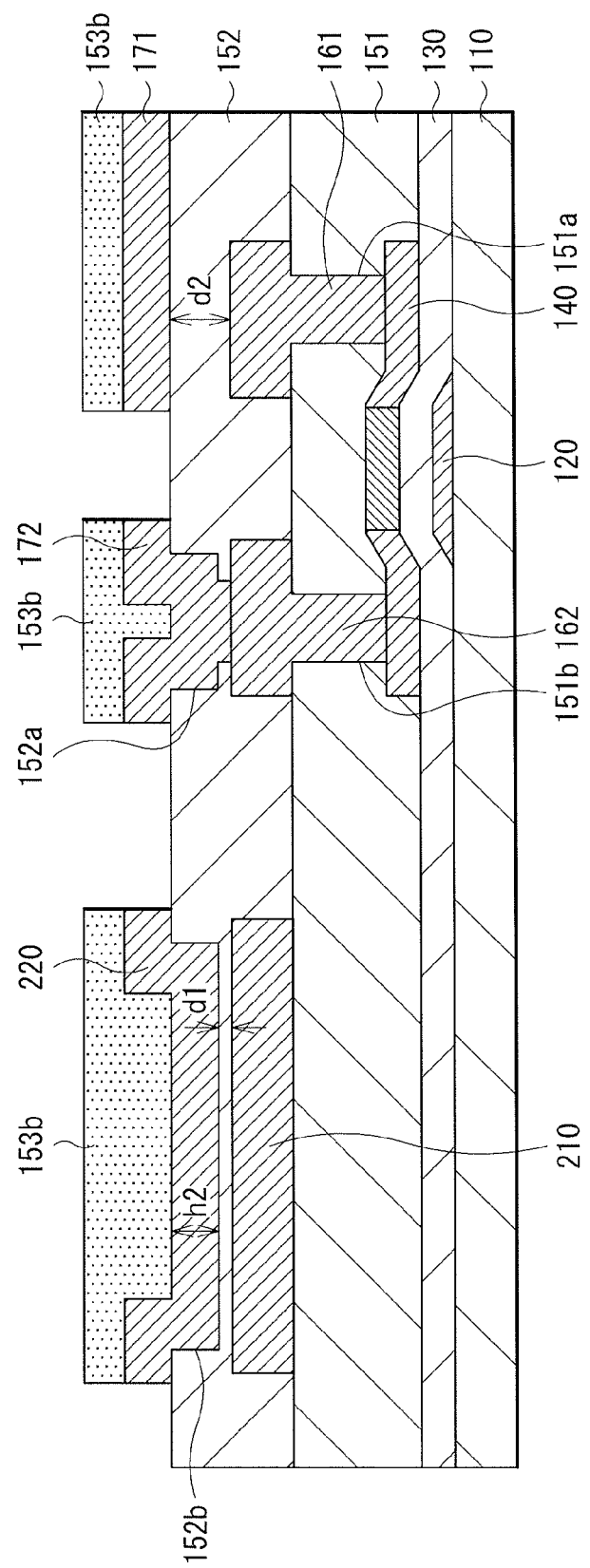
FIG. 5B is a cross-sectional view illustrating a process following FIG. 5A.

Subsequently, as illustrated in FIG. 5B, the wiring layers 171 and 172, and the metal film 220 are formed. Specifically, a metal film is deposited over the contact hole 152a and the recessed portion 152b to deposit the metal film on the interlayer insulating film 152. Then, on the metal film, a resist pattern 153b is formed. Using the resist pattern 153b, the metal film is patterned into a predetermined shape to form the wiring layers 171 and 172, and the metal film 220. It is to be noted that a film thickness of the metal film 220 may be, for example, about 100 to 1500 nm. And the wiring layer 171 may be used simply for wiring, and a film thickness d2 between the wiring layers 161 and 171 may be desirably set to satisfy a relationship of, for example, d2>(3*d1) for reduction in parasitic capacitance between wirings.

Next, after removing the resist pattern 153b, for example, silicon oxide is deposited by a CVD method to form the interlayer insulating film 153 on the interlayer insulating film 152, covering the wiring layers 171 and 172, and the metal film 220. Subsequently, after forming the contact hole 153a that reaches the wiring layer 171, a metal film is deposited on the interlayer insulating film 153 and in the contact hole 153a, and then is patterned to form the pixel electrode layer 180. Thus, the TFT 100 and the capacitor 200 as illustrated in FIG. 3B are completed.

It is to be noted that the following process involves forming, on the pixel electrode layer 180, a light emission layer made of organic materials, an electrode layer, a protective layer, and so on in this order to form the display element 16 above the TFT 100. Thus, the pixel 11 is completed.

As described above, in the pixel 11 of the display device 10 in the present embodiment, the metal film 210 as one electrode of the capacitor 200 is disposed at a same level as the wiring layers 161 and 162 that are electrically connected to the semiconductor layer 140 in the TFT 100. Over the metal film 210, the metal film 220 as another electrode of the capacitor 200 is disposed with the interlayer insulating film 152 in between. The metal films 210 and 220 allow independent and easy fabrication without restrictions due to the gate electrode film 120 and the pixel electrode layer 180, contributing to reduction in resistance of the whole wiring of the pixel 11. Accordingly, in the pixel 11 of the display device 10, wiring delay is prevented, which facilitates an increase in the number of the pixels 11 and allows high speed drive of the pixel 11, improving performance.

In the method of manufacturing the display device according to the present embodiment, it is possible for the interlayer insulating film 152 between the pair of metal films 210 and 220 of the capacitor 200 to be separately formed with a variation in film quality, the film thickness d1, or a lamination structure between a portion that constitutes the capacitor 200 and a portion other than the portion that constitutes the capacitor 200. Hence, it is possible to maintain desired characteristics as the capacitor 200 and to reduce parasitic capacitance between wirings. Accordingly, in the pixel 11 of the display device 10, occurrence of noises and so on is restrained, which leads to higher image quality of the pixel 11, improving performance.

In the following, description will be given on second to eight embodiments and modification examples 1 and 2. It is to be noted that same components as the first embodiment are denoted by same reference numerals, and description thereof will be omitted.

2. Second Embodiment

In the second embodiment, description will be given, with reference to FIG. 6A and FIG. 6B, on a case that a capacitor 200a, which constitutes a pixel 11a of the display device 10, is provided above another capacitor (a capacitor 300, a second capacitor).

Figure 6B:
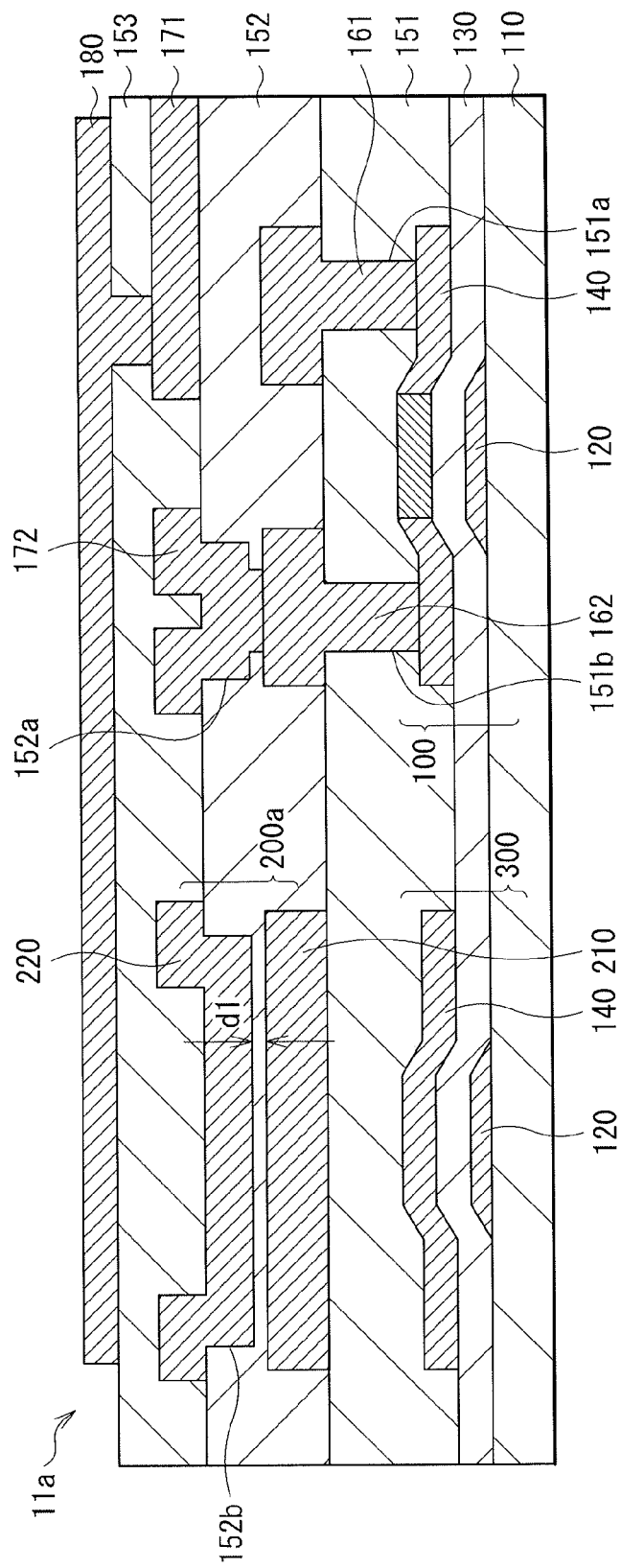
FIG. 6B is a cross-sectional view illustrating the configuration of the TFT and the capacitor illustrated in FIG. 6A.

FIG. 6A illustrates a plan configuration of the TFT 100 and the capacitors 200a and 300 of the pixel 11. FIG. 6B illustrates a cross-sectional configuration along a dot dash line X-X of the pixel 11 in FIG. 6A.

In the pixel 11a, as illustrated in FIGS. 6A and 6B, the capacitor 200a is formed at a position above the capacitor 300 that is disposed on the left side of the TFT 100 in the figure. Otherwise, the configuration is similar to that of the pixel 11 according to the first embodiment.

Moreover, in the pixel 11a, for example, as described with reference to FIG. 4A, on the glass substrate 110, a metal thin film is deposited by a sputtering method or the like, and then is patterned to form an electrode film 320 as well as the gate electrode film 120. The electrode film 320 is to serve as one electrode of the capacitor 300. On the glass substrate 110 on which the gate electrode films 120 and 320 are formed, the gate insulating film 130 is formed. On the gate insulating film 130, for example, an amorphous silicon layer is deposited. The amorphous silicon layer is crystallized into a polysilicon layer. The polysilicon layer is subjected to implantation of impurities and activation at a predetermined portion, and then is patterned to newly form a semiconductor layer 340 as well as the semiconductor layer 140. The semiconductor layer 340 is to serve as another electrode of the capacitor 300.

In the subsequent processes, similar manufacturing processes to those of the first embodiment are carried out to form the pixel 11 *a* of the display device 10.

As described above, also in the pixel 11 *a* of the display device 10 according to the present embodiment, the metal film 210 as one electrode of the capacitor 200*a* is disposed at a same level as the wiring layers 161 and 162 that are electrically connected to the semiconductor layer 140 in the TFT 100. Over the metal film 210, the metal film 220 as another electrode of the capacitor 200*a* is disposed with the interlayer insulating film 152 in between. The metal films 210 and 220 allow independent and easy fabrication without restrictions due to the gate electrode film 120, the electrode film 320, and the pixel electrode layer 180, contributing to reduction in resistance of the whole wiring of the pixel 11*a*. Accordingly, in the pixel 11 of the display device 10, wiring delay is prevented, which facilitates an increase in the number of the pixels 11 *a* and allows high speed drive of the pixel 11*a*, improving performance.

Moreover, in the method of manufacturing the display device according to the present embodiment, similarly to the above-described first embodiment, it is possible for the interlayer insulating film 152 to be separately formed with a variation in film quality, the film thickness d1, or a lamination structure between a portion that constitutes the capacitor 200*a* and a portion other than the portion that constitutes the capacitor 200*a*. Hence, it is possible to maintain desired characteristics as the capacitor 200*a* and to reduce parasitic capacitance between wirings. Accordingly, in the pixel 11 of the display device 10, occurrence of noises and so on is restrained, which leads to higher image quality of the pixel 11*a*, improving performance.

Furthermore, since the capacitor 200*a* and the capacitor 300 of the pixel 11*a* have electrodes in different layers from each other, it is possible to dispose the capacitor 200*a* and the capacitor 300 in an overlapped relationship in plan view. Accordingly, in the pixel 11*a* of the display device 10, storage capacity per unit area is enhanced, making it possible to improve image quality in attaining highly fineness of the pixels 11*a*. In other words, it is possible to provide the display device 10 having high performance.

3. Third Embodiment

In the third embodiment, description will be given, with reference to FIG. 7A and FIG. 7B, on a case that the metal film 210 of the capacitor 200 and the wiring layer 162 are integrally formed as a continuous common layer.

Figure 7B:
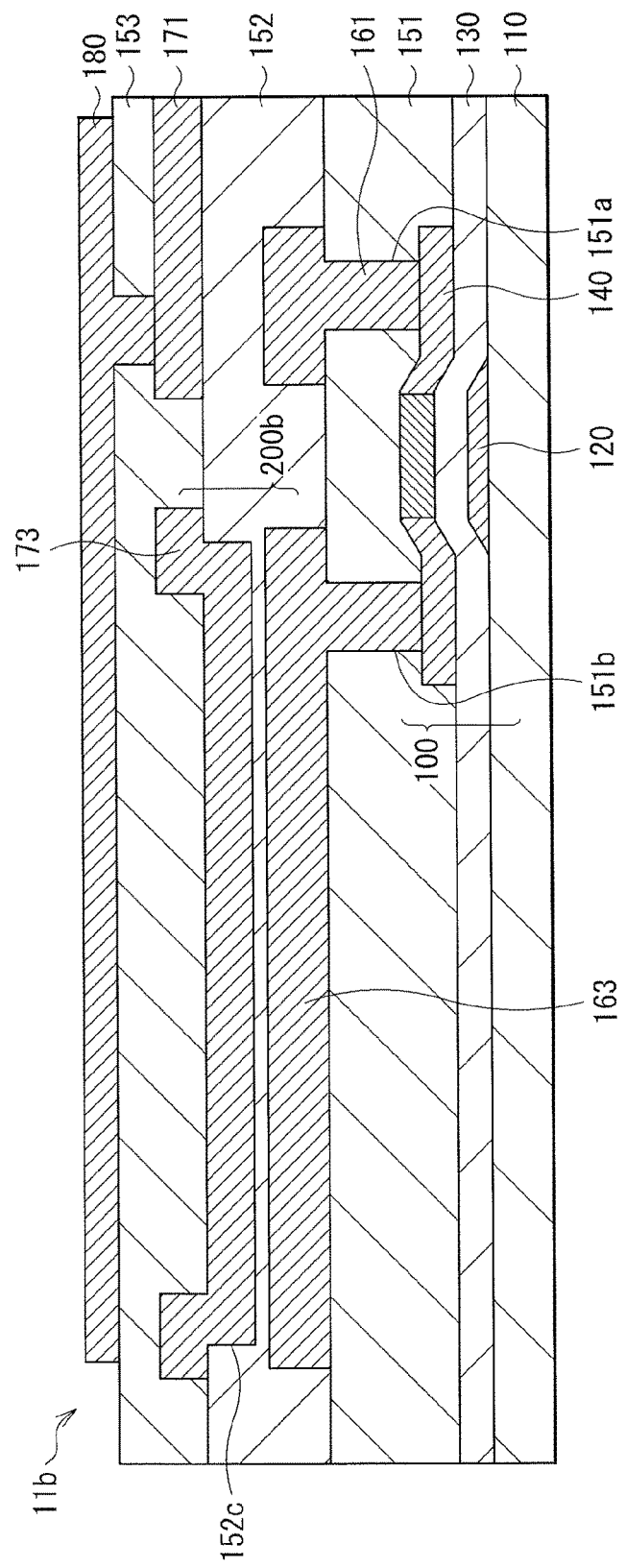
FIG. 7B is a cross-sectional view illustrating the configuration of the TFT and the capacitor illustrated in FIG. 7A.

FIG. 7A illustrates a plan configuration of the TFT 100 and a capacitor 200*b* of a pixel 11*b*. FIG. 7B illustrates a cross-sectional configuration along a dot dash line X-X of the pixel 11*b* in FIG. 7B.

In the pixel 11*b*, as illustrated in FIGS. 7A and 7B, on the interlayer insulating film 151, a wiring layer 163, which is electrically connected to the semiconductor layer 140, is formed extending to the left side in the figure. Furthermore, in a recessed portion 152*c* that is formed in the interlayer insulating film 152, a metal film 173 is formed facing the wiring layer 163. In the present embodiment, the wiring layer 163 and the metal film 173 serve as a pair of electrodes of the capacitor 200*b*. Otherwise, the configuration is similar to that of the pixel 11*b* according to the first embodiment.

Moreover, in the pixel 11*b*, for example, as described with reference to FIG. 4B, a metal film is deposited on the interlayer insulating film 151 in which the contact holes 151*a* and 151*b* are formed, and then is patterned to form the wiring layer 163 as well as the wiring layer 161. Also, as described with reference to FIG. 5A, the interlayer insulating film 152 is formed on the interlayer insulating film 151, covering the wiring layers 161 and 163. The recessed portion 152*c* is formed, facing the wiring layer 163, by etching at a predetermined position of the interlayer insulating film 152.

In the subsequent processes, similar manufacturing processes to those of the first embodiment are carried out to form the pixel 11 *b* of the display device 10.

In the pixel 11*b* of the display device 10 according to the present embodiment, the wiring layer 163, which is electrically connected to the semiconductor layer 140 of the TFT 100, is disposed extending to an opposite side to the wiring layer 161 (to the left side in FIG. 7). Furthermore, the metal film 173 is provided on the wiring layer 163 with the interlayer insulating film 152 in between, and one electrode of the capacitor 200*b* is configured as a common layer to the wiring layer 163 of the TFT 100. The wiring layer 163 and the metal film 173 allow independent and easy fabrication without restrictions due to the gate electrode film 120 and the pixel electrode layer 180, contributing to reduction in resistance of the whole wiring of the pixel 11*b*. Accordingly, in the pixel 11*b* of the display device 10, wiring delay is prevented, which facilitates an increase in the number of the pixels 11*b* and allows high speed drive of the pixel 11*b*, improving performance.

Moreover, in the method of manufacturing the display device according to the present embodiment, similarly to the above-described first embodiment, it is possible for the interlayer insulating film 152 to be separately formed with a variation in film quality, the film thickness d1, or a lamination structure between a portion that constitutes the capacitor 200*b* and a portion other than the portion that constitutes the capacitor 200*b*. Hence, it is possible to maintain desired characteristics as the capacitor 200*b* and to reduce parasitic capacitance between wirings. Accordingly, in the pixel 11 *b* of the display device 10, occurrence of noises and so on is restrained, which leads to higher image quality and improved performance.

Moreover, it is possible to allow the capacitor 200*b* to have larger area, in plan view, than, for example, that of the capacitor 200 according to the first embodiment. This makes it possible to increase a total sum of storage capacity per unit area.

It is to be noted that, in the pixel 11*b*, it is possible to allow the wiring layer 163 to extend further to the wiring layer 161 side. Details of this case will be explained with reference to FIG. 8.

Figure 8B:
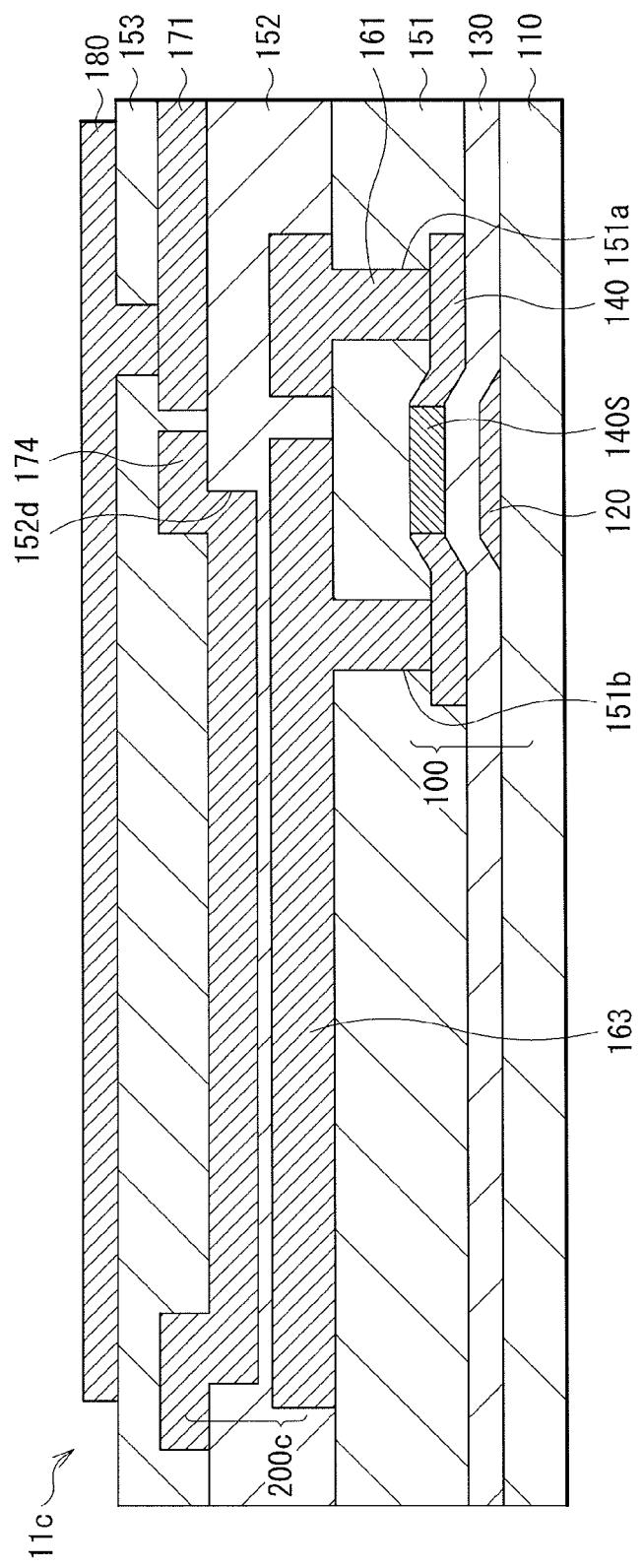
FIG. 8B is a cross-sectional view illustrating the configuration of the TFT and the capacitor illustrated in FIG. 8A.

FIG. 8A illustrates a plan configuration of the TFT 100 and a capacitor 200*c* of a pixel 11*c*. FIG. 8B illustrates a cross-sectional configuration along a dot dash line X-X of the pixel 11*c* in FIG. 8A.

In the pixel 11*c*, as illustrated in FIG. 8A, a wiring layer 164 is disposed extending to the wiring layer 161 side (to the right side in the figure), too. The wiring layer 164 substantially overlaps the channel region 140S of the TFT 100 in plan view. Furthermore, a metal film 174 is disposed facing the wiring layer 164.

Also in this case, it is possible to obtain similar effects to those of the above described pixel 11*b*. Since the wiring layer 164 and the metal film 174 overlap the channel region 140S of the TFT 100, it is possible to allow the wiring layer 164 and the metal film 174 to have a function of a shielding film for the TFT 100, restraining occurrence of an optical leak current.

It is to be noted that, in the pixel 11*b* or 11*c* according to the third embodiment, it is possible to dispose, below the capacitor 200b or 200c, the capacitor 300 as described in the second embodiment. In this case, it is possible to increase storage capacity per unit area, further enhancing performance of the pixels 11 b and 11c in attaining higher definition of the display device 10.

4. Fourth Embodiment

In the fourth embodiment, description will be given, with reference to FIG. 9A and FIG. 9B, on a case that the interlayer insulating film 152 has a layered structure (a two-layered structure, as exemplified; an interlayer insulating film 152A and a high dielectric interlayer film 152B), and the high dielectric interlayer film 152B is formed between the metal films 210 and 220.

Figure 9B:
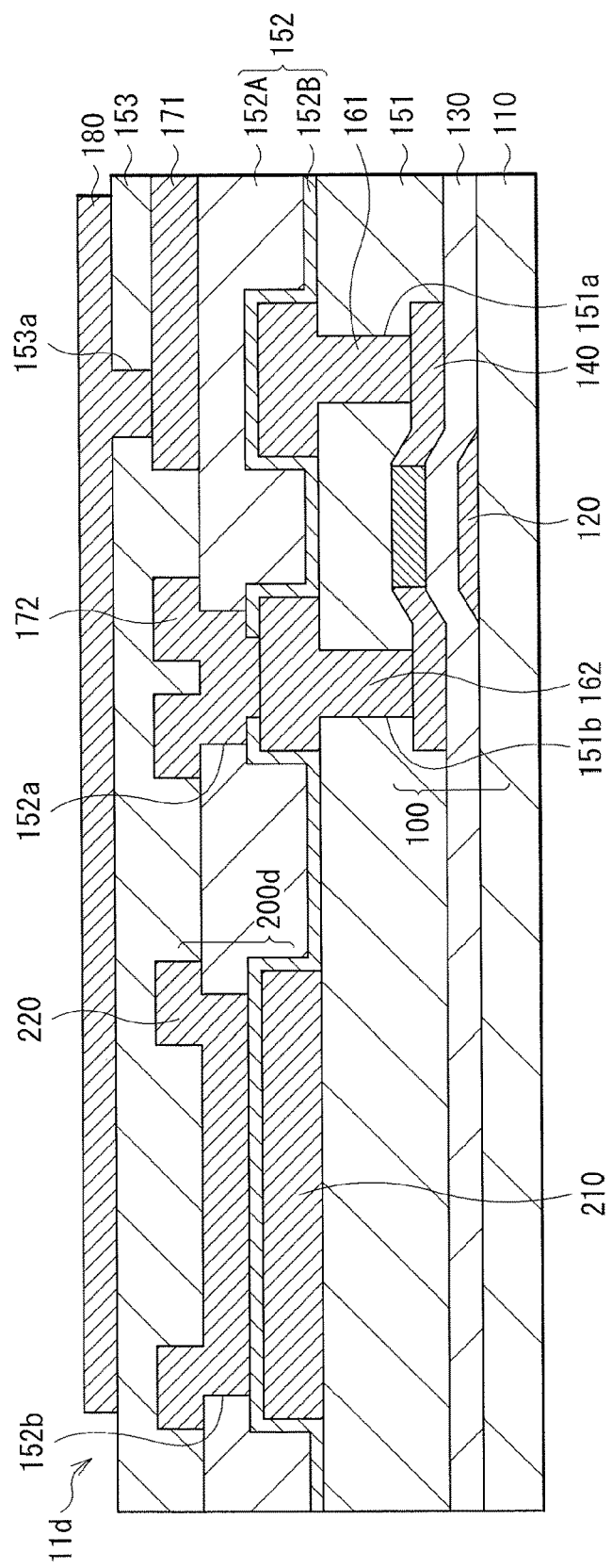
FIG. 9B is a cross-sectional view illustrating the configuration of the TFT and the capacitor illustrated in FIG. 9A.

FIG. 9A illustrates a plan configuration of the TFT 100 and a capacitor 200d of a pixel 11d. FIG. 9B illustrates a cross-sectional configuration along a dot dash line X-X of the pixel 11d in FIG. 9A.

In the pixel 11d of the display device 10 according to the present embodiment, as mentioned above, the interlayer insulating film 152 has a layered structure, that is, a configuration in which the high dielectric interlayer film 152b and the interlayer insulating film 152A are stacked in this order from the interlayer insulating film 151 side. In the present embodiment, the high dielectric interlayer film 152b is disposed between the metal film 210 and the metal film 220, which constitute the capacitor 200d.

As a constituent material of the high dielectric interlayer film 152B, a material having a high dielectric constant may be preferably used. Examples of such materials may include, as well as silicon nitride, a material having a relative dielectric constant of 10 or more, specifically, hafnium oxide, hafnium silicate, aluminum oxide, tantalum (V) oxide, titanium oxide, lanthanum oxide, zirconium oxide, and so on. These materials are used for the high dielectric interlayer film 152b in a form of a single layer film or a laminated film. Among the above-mentioned materials, in particular, silicon nitride, hafnium oxide, aluminum oxide and tantalum (V) oxide may be preferably used. Moreover, here, as exemplified, the high dielectric interlayer film 152B is formed as a continuous film on the interlayer insulating film 151 and the wiring layer 161, but this is not limitative. Instead, the high dielectric interlayer film 152B may be selectively provided at a position facing the capacitor 200d. Alternatively, without forming the high dielectric interlayer film 152b separately, a layer that is provided in a region other than the pixel 11 d may be extended for use. The layer that is provided in a region other than the pixel 11d may be, for example a layer that is provided in a peripheral region other than a display region (both not illustrated) where the pixels 11d are provided. Moreover, the interlayer insulating film 152A may be configured of a similar material to that of the interlayer insulating film 152 according to the above-described embodiment. Moreover, except for the interlayer insulating film 152, the configuration is similar to that of the pixel 11 according to the first embodiment.

Next, description will be given, with reference to FIGS. 10A and 10B, on a method of manufacturing the TFT 100 and the capacitor 200d that constitute the pixel 11d.

First, similarly to the first embodiment, on the glass substrate 110, the TFT 100 and the interlayer insulating film 151 are formed. After this, the wiring layers 161 and 162, and the metal film 210 are formed.

Figure 10A:
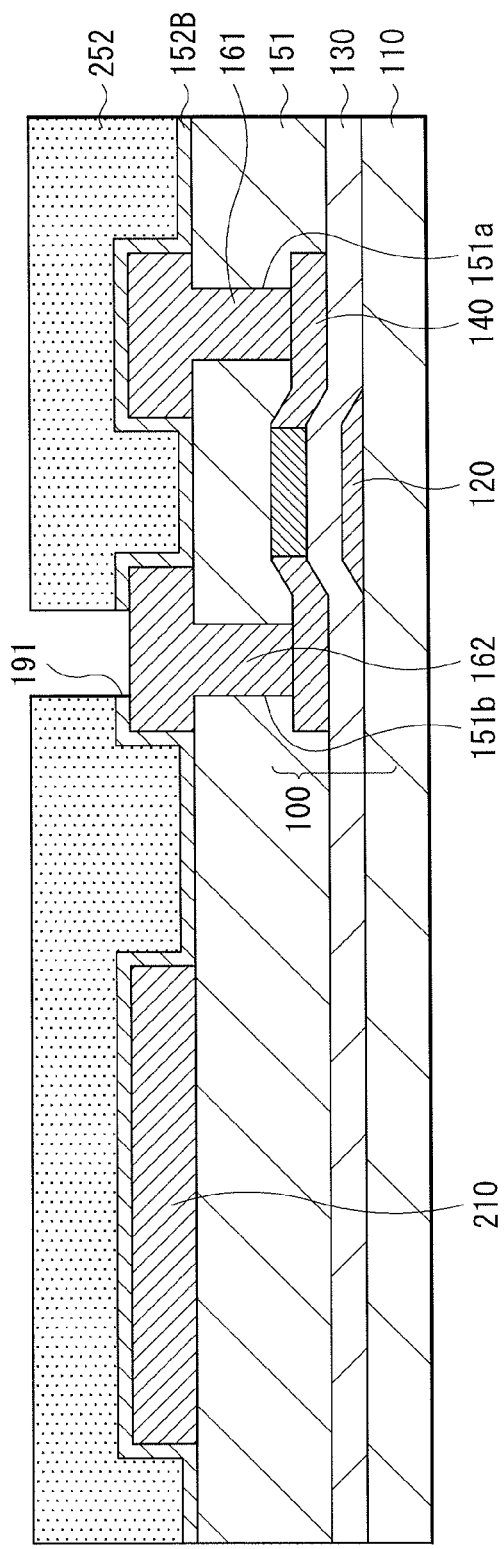
FIG. 10A is a cross-sectional view illustrating a manufacturing process of the TFT and the capacitor illustrated in FIG. 9B.

Subsequently, as illustrated in FIG. 10A, the high dielectric interlayer film 152B is formed. Specifically, for example, hafnium silicate film is deposited by a CVD method or a sputtering method on the interlayer insulating film 151, covering the wiring layers 161 and 162, and the metal film 210. Then, on the film, a resist pattern 252 is formed. Using the resist pattern 252, the film is patterned into a predetermined shape to form an opening. Thus, the high dielectric interlayer film 152B having a contact hole 191 is formed.

Figure 10B:
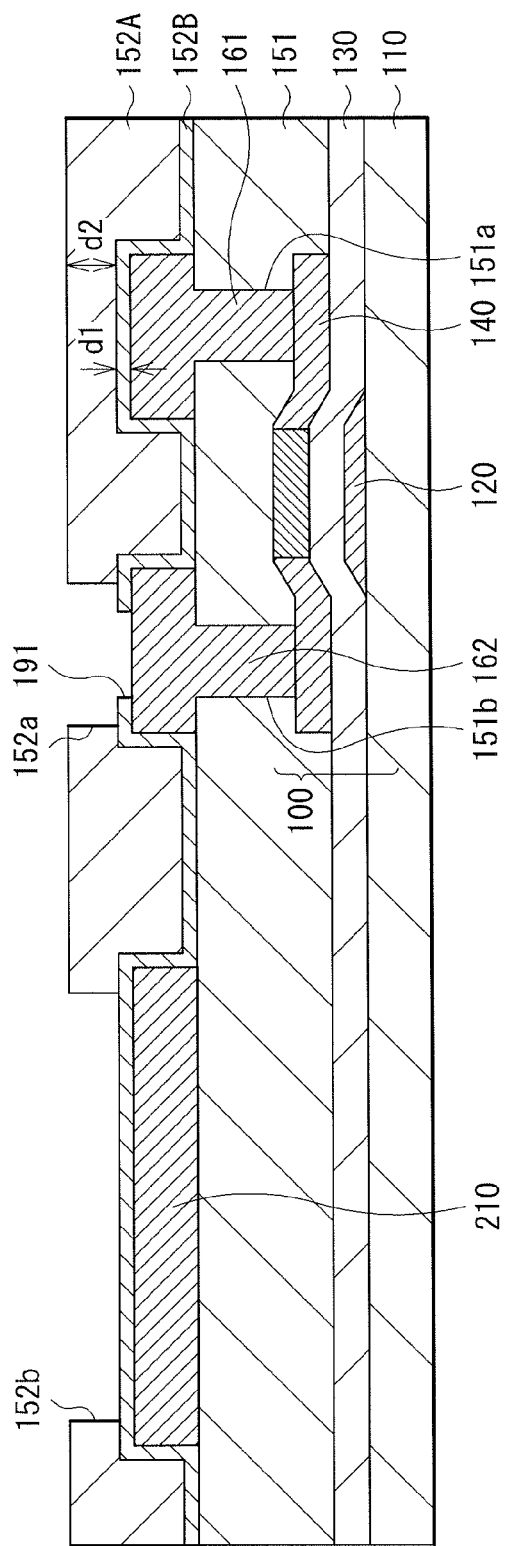
FIG. 10B is a cross-sectional view illustrating a process following FIG. 10A.

Next, as illustrated in FIG. 10B, the interlayer insulating film 152A is formed. Specifically, first, the resist pattern 252 is removed. After this, for example, silicon oxide is deposited by a CVD method on the high dielectric interlayer film 152B. Subsequently, the contact hole 152a and the recessed portion 152b are formed by lithography and etching at predetermined positions of the silicon oxide film. The contact hole 152a reaches the wiring layer 162. The recessed portion 152b reaches the high dielectric interlayer film 152B. Thus, the interlayer insulating film 152 is formed. It is to be noted that, also in the fourth embodiment, the wiring layer 171 may be desirably used simply for wiring, and, for example, the film thickness d2 in FIG. 10B may be desirably set to satisfy a relationship of $d2>(3*d1)$ for reduction in parasitic capacitance. Specifically, d1 may be 50 to 500 nm, and d2 may be 150 to 3000 nm. Moreover, regarding a positional relationship of the contact holes 191 and 152a, they may be disposed to have an overlap in plan view. Regarding sizes of the contact holes 191 and 152a, one of them may be formed within confines of another. Moreover, regarding the order of forming the contact holes 191 and 152a, either of them may be formed earlier.

In the subsequent processes, similar manufacturing processes to the process of FIG. 5B and the succeeding processes of the first embodiment are carried out to form the pixel 11d of the display device 10.

As described above, also in the pixel 11d of the display device 10 according to the present embodiment, the metal film 210 as one electrode of the capacitor 200d is disposed at a same level as the wiring layers 161 and 162 that are electrically connected to the semiconductor layer 140 of the TFT 100. Over the metal film 210, the metal film 220 as another electrode of the capacitor 200d is disposed with the interlayer insulating film 152 in between. The metal films 210 and 220 allow independent and easy fabrication without restrictions due to the gate electrode film 120 and the pixel electrode layer 180, contributing to reduction in resistance of the whole wiring of the pixel 11d. Accordingly, in the pixel 11d of the display device 10, wiring delay is prevented, which facilitates an increase in the number of the pixels 11d and allows high speed drive of the pixel 11d, improving performance.

In the method of manufacturing the display device according to the present embodiment, similarly to the above-described first embodiment, it is possible for the interlayer insulating film 152 to be separately formed with a variation in film quality, the film thickness d1, or a lamination structure between a portion that constitutes the capacitor 200d and a portion other than the portion that constitutes the capacitor 200d. Hence, it is possible to maintain desired characteristics as the capacitor 200d and to reduce parasitic capacitance between wirings. Accordingly, in the pixel 11d of the display device 10, occurrence of noises and so on is restrained, which leads to higher speed drive and higher image quality of the pixel 11d, improving performance.

Furthermore, in the present embodiment, the interlayer insulating film 152 has a layered structure, and one layer (the high dielectric interlayer film 152b) of the layered structure is configured of a material having a high dielectric constant, and is formed on the wiring layers 161 and 162, and the metal film 210. In this way, surfaces of the wiring layers 161 and 162, and the metal film 210 are protected in a case that a repair process is carried out during a period from the formation of the wiring layers 161 and 162, and the metal film 210 to the formation of the wiring layers 171 and 172, and the metal film 220. Hence, it is possible to prevent damage to the wiring layers 161 and 162, and the metal film 210, restraining degradation of the pixels 11d and so on.

It is to be noted that the high dielectric interlayer film 1526 of the pixel 11d according to the fourth embodiment may be similarly applied to the pixels 11, 11a, 11b, and 11c according to the first to third embodiments.

5. Fifth Embodiment

In the fifth embodiment, description will be given, with reference to FIG. 11, on a case that a TFT of a top gate type is used as the TFT 100 that constitutes a pixel 11e.

Figure 11:
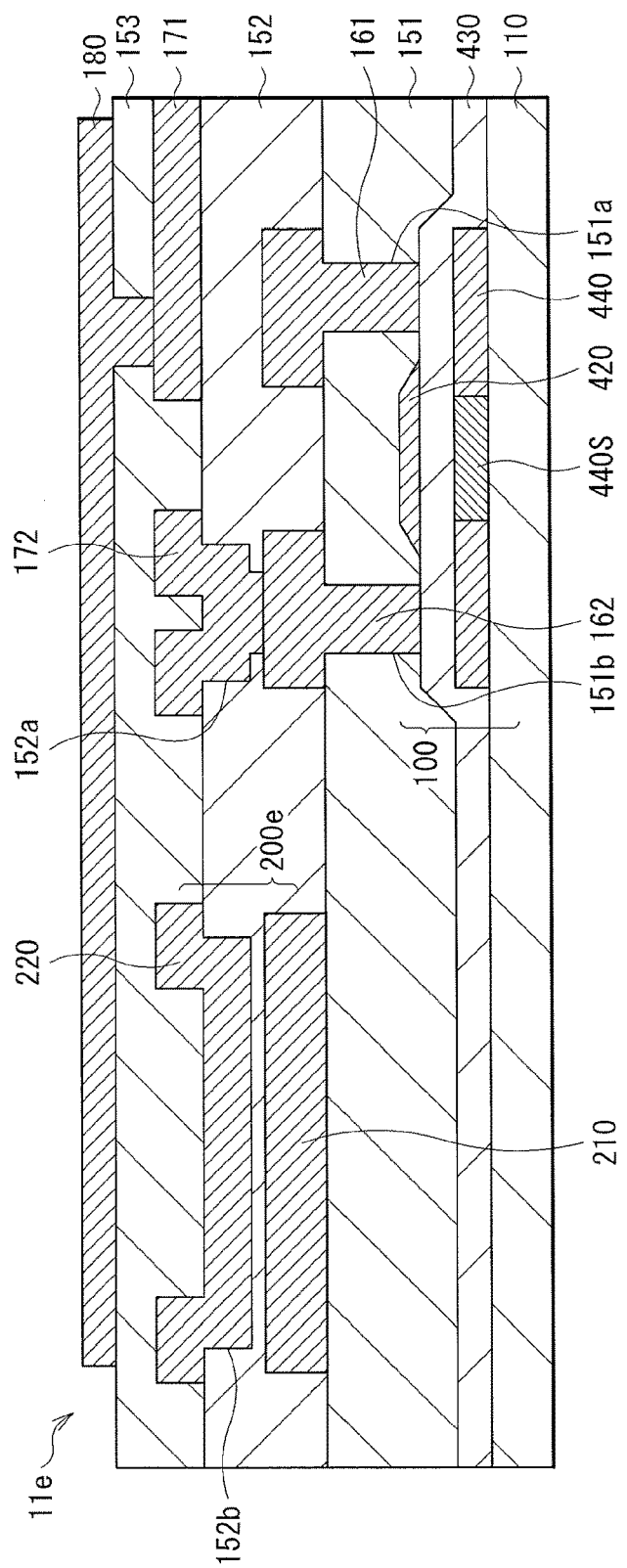
FIG. 11 is a cross-sectional view illustrating a configuration of a TFT and a capacitor according to a fifth embodiment.

FIG. 11 illustrates a cross-sectional configuration of the TFT 100 and a capacitor 200e according to the fifth embodiment. It is to be noted that a plan configuration of the pixel 11e illustrated in FIG. 11 may be represented similarly to FIG. 3A.

As the pixel 11e, FIG. 11 illustrates a TFT 100 of a top gate type, in which, on the glass substrate 110, an undercoat insulating film (not illustrated), a semiconductor layer 440, a gate insulating film 430, and a gate electrode film 420 are laminated in this order.

It is to be noted that, regarding the semiconductor layer 440, the gate insulating film 430, and the gate electrode film 420, same materials as the semiconductor layer 140, the gate insulating film 130, and the gate electrode film 120 as explained in the first embodiment may be applicable, respectively. Moreover, except for the undercoat insulating film, the semiconductor layer 440, the gate insulating film 430, and the gate electrode film 420, the configuration is similar to that of the pixel 11e as described in the first embodiment.

In the pixel 11e, first, on the glass substrate 110, by a plasma CVD method, silicon oxide, silicon nitride, or the like is deposited to form the undercoat insulating film as a structure that prevents impurity diffusion. Moreover, on the undercoat insulating film, for example, an amorphous silicon layer is deposited by a CVD method. The amorphous silicon layer is crystallized by ELA or the like. On this occasion, a possible alternative is to directly deposit a polysilicon layer by a CVD method or the like. The polysilicon layer thus crystallized is subjected to implantation of impurities and activation at a predetermined portion, and then is patterned to form the semiconductor layer 440 (a channel region 440S). On the glass substrate 110 on which the semiconductor layer 440 is formed, a film of, for example, silicon oxide, silicon nitride, or a lamination thereof is deposited by a CVD method to form the gate insulating film 430. On the gate insulating film 430, a metal thin film is deposited by a sputtering method or the like, and then is patterned to form the gate electrode film 420.

In the subsequent processes, similar manufacturing processes to the first embodiment as described with reference to FIG. 4B to FIG. 5B are carried out to form the pixel 11e of the display device 10.

Figure 12:
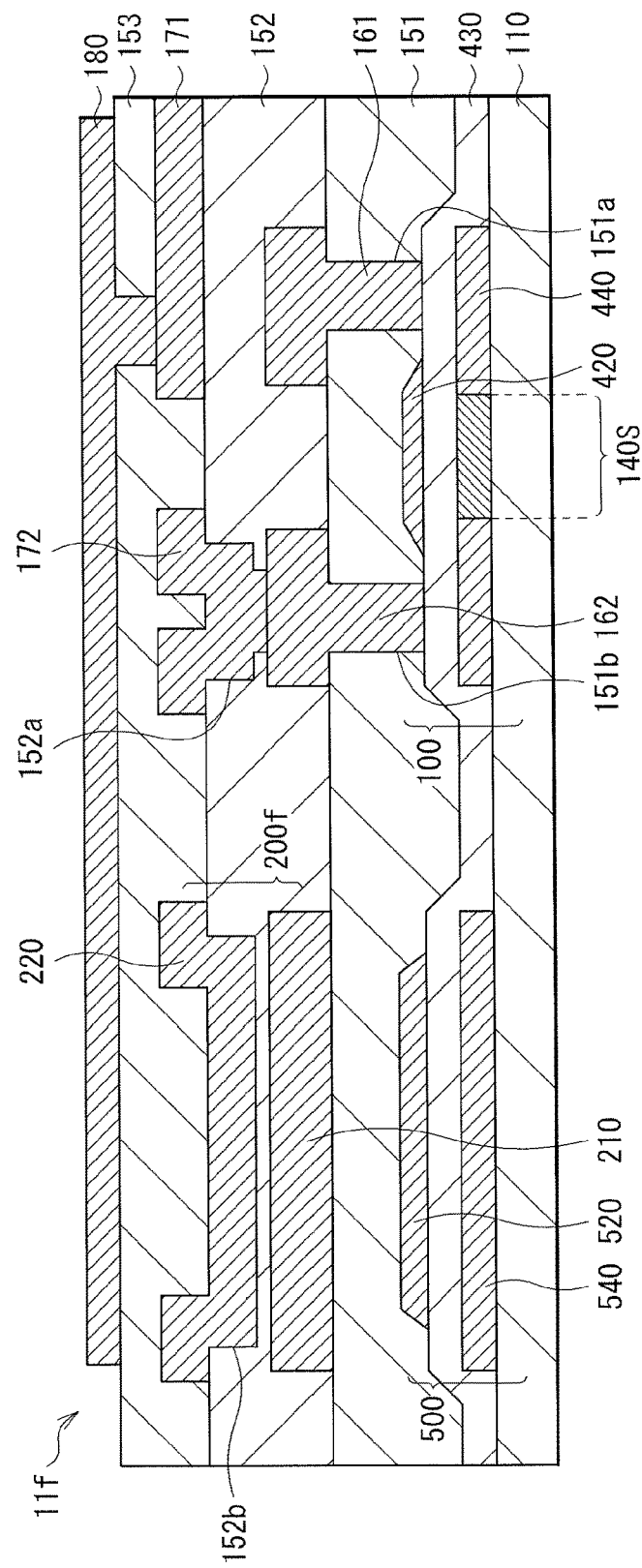
FIG. 12 is a cross-sectional view illustrating another configuration of the TFT and the capacitor according to the fifth embodiment.

Moreover, in the pixel 11e, as illustrated in FIG. 12, similarly to the second embodiment, a capacitor 200f may be formed above another capacitor.

FIG. 12 illustrates another cross-sectional configuration (a pixel 11f) of the TFT 100 and the capacitor 200f according to the fifth embodiment. It is to be noted that a plan configuration of the pixel 11f illustrated in FIG. 12 may be represented similarly to FIG. 6A.

In the pixel 11f, as illustrated in FIG. 12, the capacitor 200f is formed at a position above a capacitor 500 that is disposed on the left side of the TFT 100 in the figure. Otherwise, the configuration is similar to that of the pixel 11 according to the first embodiment.

In the pixel 11f, first, on an undercoat insulating film 430a on the glass substrate 110, for example, an amorphous silicon layer is deposited by a CVD method. The amorphous silicon layer is crystallized by ELA or the like. On this occasion, a possible alternative is to directly deposit a polysilicon layer by a CVD method or the like.

The polysilicon layer thus crystallized is subjected to implantation of impurities and activation at a predetermined portion, and then is patterned to form a semiconductor layer 540 as well as the semiconductor layer 440 (the channel region 440S). On the glass substrate 110 on which the semiconductor layers 440 and 540 are formed, a film of silicon oxide, silicon nitride, or a lamination thereof is deposited by a CVD method to form the gate insulating film 430. And on the gate insulating film 430, a metal thin film is deposited by a sputtering method or the like, and then is patterned to form a gate electrode film 520 as well as the gate electrode film 420.

In the subsequent processes, similar manufacturing processes to the first embodiment as described with reference to FIG. 4B to FIG. 5 are carried out to form the pixel 11f of the display device 10.

As described above, in the pixel 11e or 11f of the display device 10, the metal film 210 is disposed at a same level as the wiring layers 161 and 162 that are electrically connected to the semiconductor layer 440. The wiring layers 161 and 162 are disposed above the TFT 100 that includes the gate insulating film 430, the semiconductor layer 440 laminated on the undercoat insulating film 430a, and the gate electrode film 420 that is laminated on an opposite side to the semiconductor layer 440 of the gate insulating film 430. Furthermore, the metal film 220 is disposed over the metal film 210 with the interlayer insulating film 152 in between, forming the capacitor 200e or 200f including the metal films 210 and 220. The metal films 210 and 220 allow independent and easy fabrication without restrictions due to the gate electrode film 420 and the pixel electrode layer 180, contributing to reduction in resistance of the whole wiring of the pixel 11e or 11f. Accordingly, in the pixel 11e or 11f of the display device 10, wiring delay is prevented, which facilitates an increase in the number of the pixel 11e or 11f and allows high speed drive of the pixel 11e or 11f, improving performance.

Moreover, in the capacitor 200e or 200f that includes the metal films 210 and 220, it is possible for the interlayer insulating film 152, which is disposed between the metal films 210 and 220, to be separately formed with a variation in film quality, the film thickness, or a lamination structure, regarding a region other than the capacitor 200e or 200f. Hence, it is possible to maintain desired characteristics as the capacitor 200e or 200f and to reduce parasitic capacitance between wirings. Accordingly, in the pixel 11e or 11f of the display device 10, occurrence of noises and so on is restrained, which leads to higher image quality of the pixel 11e or 11f, improving performance.

Furthermore, in the case of the pixel 11f, the electrodes of the capacitor 200f are formed in different layers from those of the capacitor 500, allowing the capacitor 200f and the capacitor 500 to be disposed in an overlapped relationship in plan view. Accordingly, in the pixel 11f of the display device 10, storage capacity per unit area is increased, improving performance of the pixel 11f.

It is to be noted that the pixels 11e and 11f according to the fifth embodiment allows application of the wiring layers 163 and 164, and the high dielectric interlayer film 152B according to the third and the fourth embodiments, leading to a further increase in a total sum of storage capacity. Moreover, in a case that the high dielectric interlayer film 152B is formed, it is possible to prevent damage to the wiring layers 161 and 162, and the metal film 210, restraining degradation of the pixels 11e and 1 if and so on.

6. Sixth Embodiment

Figure 13A:
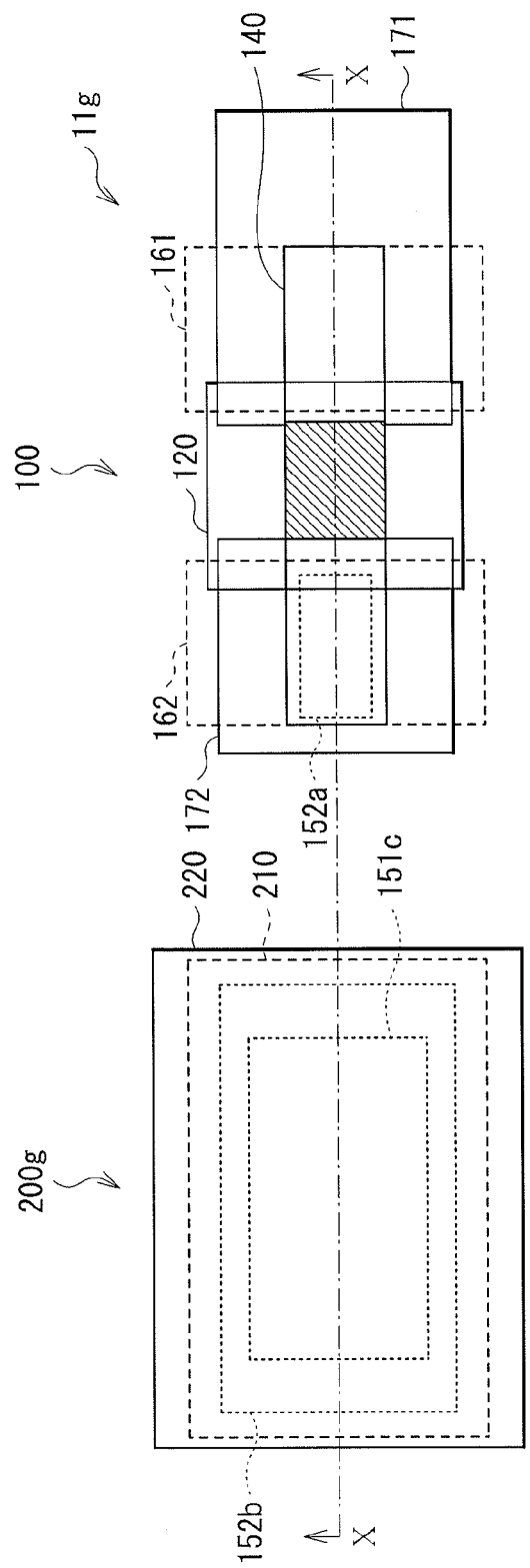
FIG. 13A is a plan view illustrating a configuration of a TFT and a capacitor according to a sixth embodiment.
Figure 13B:
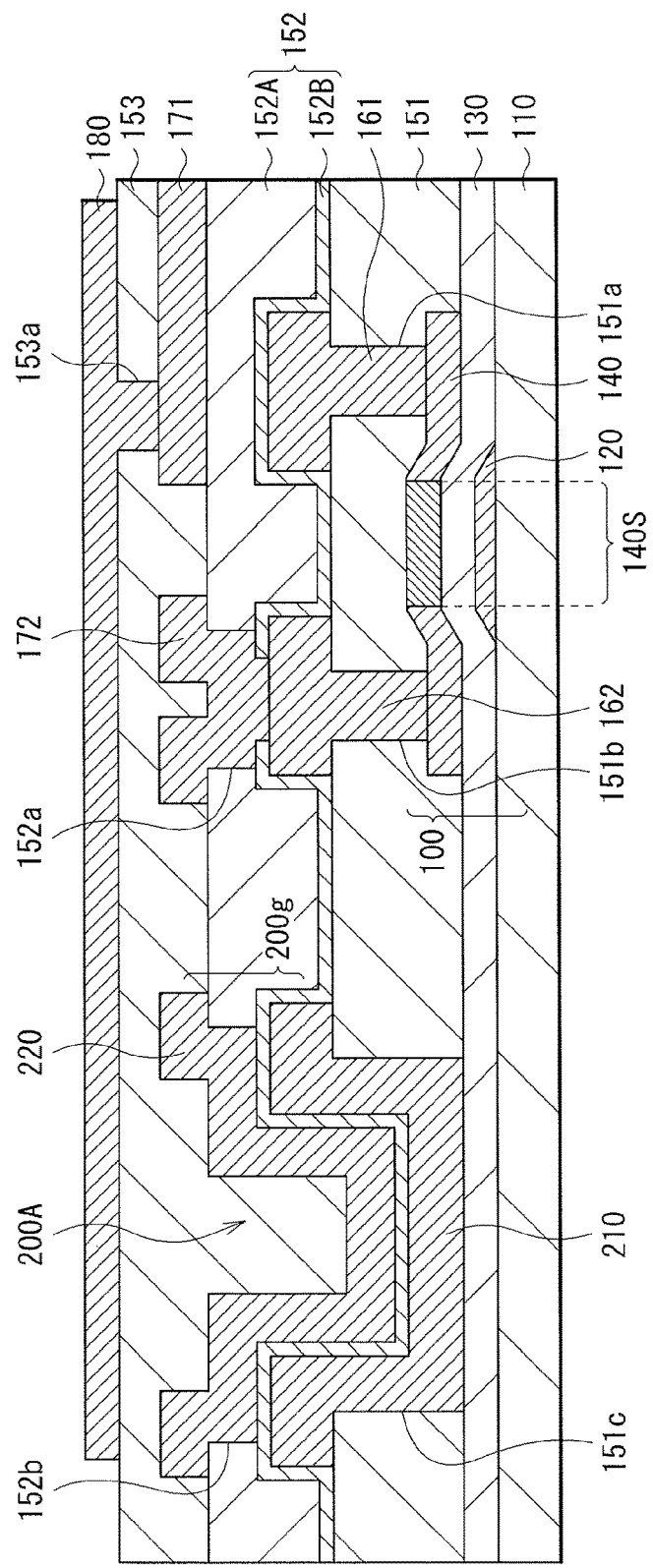
FIG. 13B is a cross-sectional view illustrating the configuration of the TFT and the capacitor illustrated in FIG. 13A.

FIG. 13A illustrates a plan configuration of the TFT 100 and a capacitor 200g of a pixel 11g that constitutes the display device 10 according to the sixth embodiment. FIG. 13B illustrates a cross-sectional configuration along a dot dash line X-X of the pixel 11g illustrated in FIG. 13A. In the pixel 11g, similarly to the fourth embodiment, the interlayer insulating film 152 (a first interlayer insulating film) has a layered structure, and the high dielectric interlayer film 152B is provided between the metal film 210 and the metal film 220 that constitute the capacitor 200g. However, the present embodiment is different from the fourth embodiment in that a recessed portion 200A is formed in an in-plane direction of the capacitor 200g (a first capacitor).

The capacitor 200g is formed along a contact hole 151c (a through hole) that penetrates the interlayer insulating film 151 (the second insulating film). Thus, the recessed portion 200A is formed in contact with the gate insulating film 130 of the TFT 100. It is to be noted that, in FIG. 13A, the capacitor 200g and the contact hole 151c are in a fully overlapped state, but they may not be in a full inclusion relationship.

The pixel 11g may be manufactured as follows. First, as illustrated in FIG. 4A, similarly to the fourth embodiment, on the glass substrate 110, the gate electrode film 120, the gate insulating film 130, and the semiconductor layer 140 are formed in this order. After this, the interlayer insulating film 151 is formed. Subsequently, as illustrated in FIG. 14A, for example, using a fluorine-based gas, the contact holes 151a, 151b, and 151c are formed at predetermined positions of the interlayer insulating film 151. Next, as illustrated in FIG. 14B, the wiring layers 161 and 162, the metal film 210, and the high dielectric interlayer film 152B are formed. In the subsequent processes, similar manufacturing processes to the above-described first and the fourth embodiments are carried out to complete the pixel 11g.

As described above, in the pixel 11g of the display device 10, the capacitor 200g having the recessed portion 200A in the in-plane direction is formed. The recessed portion 200A is configured of the contact hole 151c, which is formed in the same process as the process of forming the contact holes 151a and 151b for the wiring layers 161 and 162 that are electrically connected to the driving TFT 100. Thus, it is possible to form, not only in a planar direction but also three-dimensionally in a film thickness direction of the interlayer insulating film 151, a structure (a capacitor structure) in which the metal films 210 and 220 are disposed facing each other with the high dielectric interlayer film 152B in between.

As described above, in the pixel 11g of the display device 10 according to the present embodiment, the contact hole 151c is provided at a predetermined position of the interlayer insulating film 151, forming the capacitor 200g having the recessed portion 200A. In this way, it is possible to provide the capacitor structure not only in the in-plane direction but also in a vertical direction (the film thickness direction) of the interlayer insulating film 151. Hence, it is possible to obtain, in addition to effects of the fourth embodiment, an effect of improving capacity per unit area. In other words, it is possible to provide a display device having higher definition and higher image quality.

It is to be noted that, in the present embodiment, the whole bottom of the recessed portion 200A is in contact with the gate insulating film 130, but this is not limitative. For example, the semiconductor layer 140 may be extended to the capacitor 200g, forming a structure in which the recessed portion 200A is in a straddling relationship with the gate insulating film 130 and the semiconductor layer 140.

7. Modification Example 1

Figure 15A:
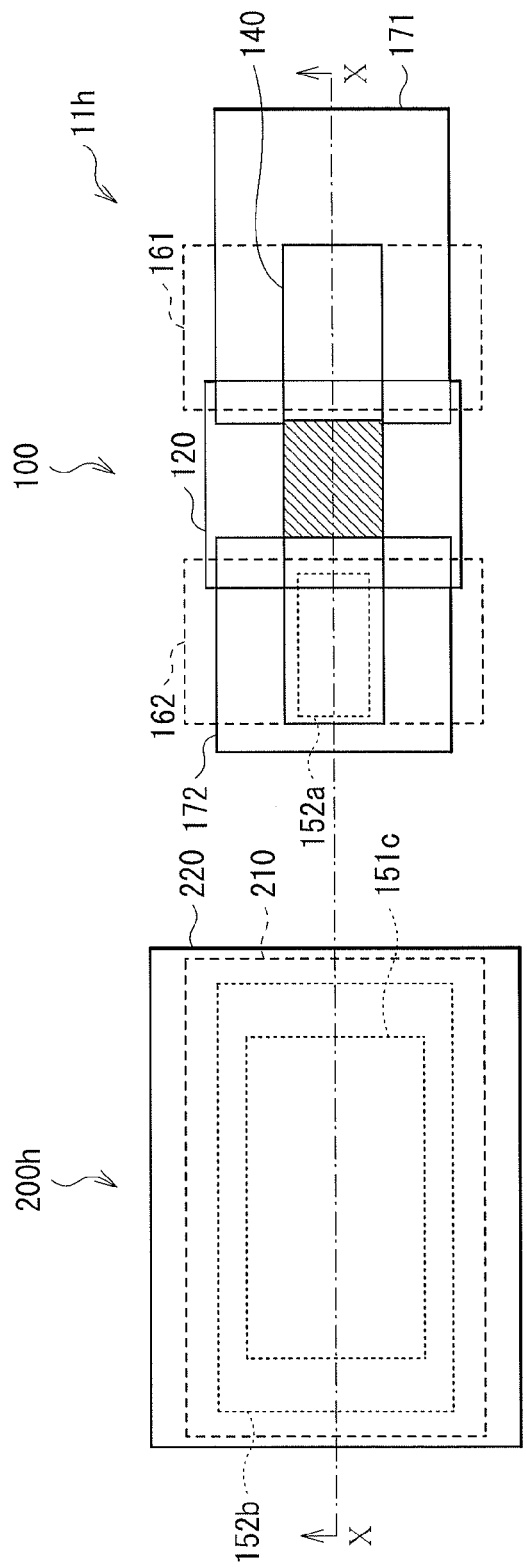
FIG. 15A is a plan view illustrating a configuration of a TFT and a capacitor according to a modification example 1.
Figure 15B:
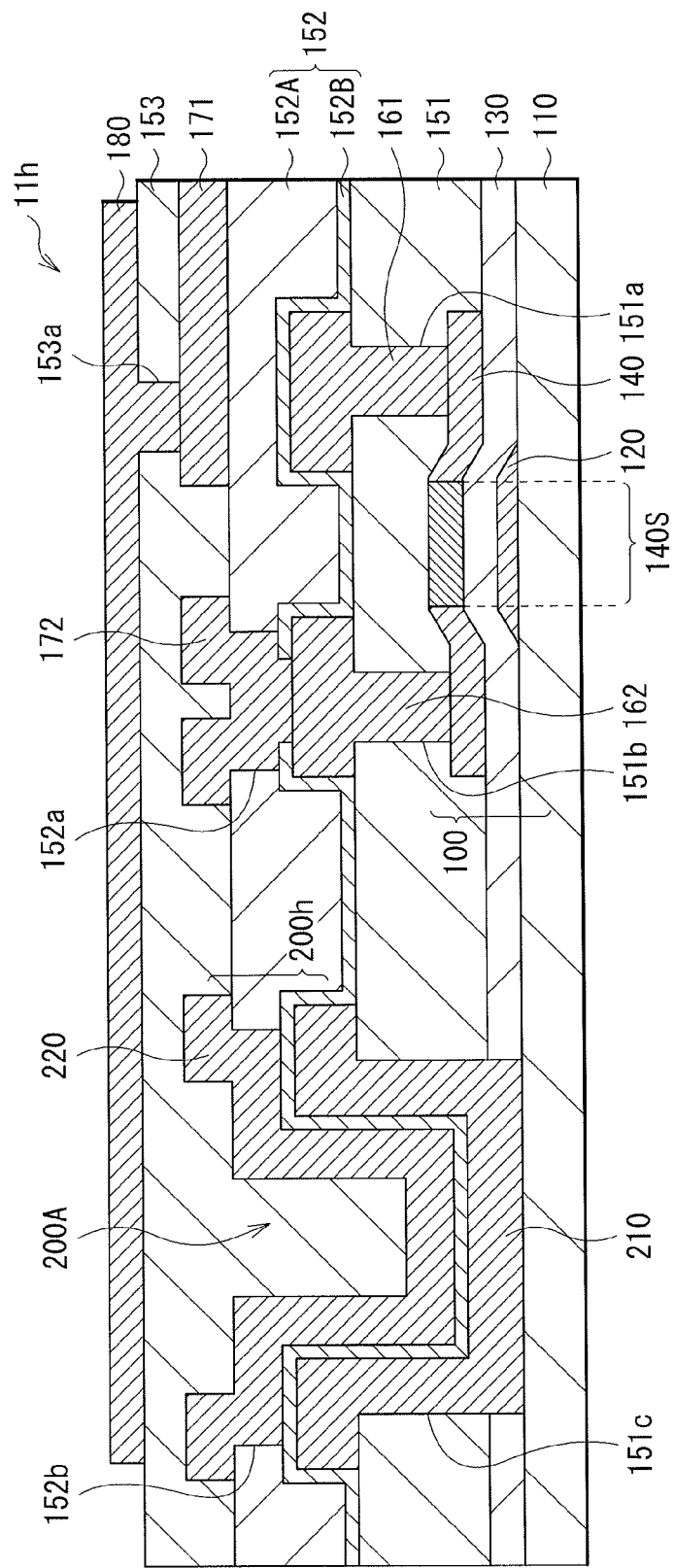
FIG. 15B is a cross-sectional view illustrating the configuration of the TFT and the capacitor illustrated in FIG. 15A.

FIG. 15A illustrates a plan configuration of the TFT 10 and a capacitor 200h that constitute a pixel 11h of the display device 10 according to one modification example of the sixth embodiment. FIG. 15B illustrates a cross-sectional configuration along a dot dash line X-X of the pixel 11h illustrated in FIG. 15A. The pixel 11h is different from the sixth embodiment in that the contact hole 151c, which forms the recessed portion 200A of the capacitor 200h, penetrates the gate insulating film 130 in addition to the interlayer insulating film 151.

As mentioned above, the recessed portion 200A of the capacitor 200h according to the present modification example is formed by the contact hole 151c that penetrates the interlayer insulating film 151 and the gate insulating film 130. The bottom of the recessed portion 200A is in contact with the glass substrate 110. The contact hole 151c is formed, similarly to the sixth embodiment, in the same process as the process of forming the contact holes 151a and 151b, by using, for example, a fluorine-based liquid chemical or a fluorine-based gas.

As described above, in the pixel 11h of the display device 10 according to the present modification example, the contact hole 151c, which forms the recessed portion 200A of the capacitor 200h, penetrates the interlayer insulating film 151 and the gate insulating film 130. Thus, a level difference due to the recessed portion 200A becomes larger by the film thickness of the gate insulating film 130, making it possible to further increase capacity per unit area of the capacitor 200h.

8. Seventh Embodiment

Figure 16A:
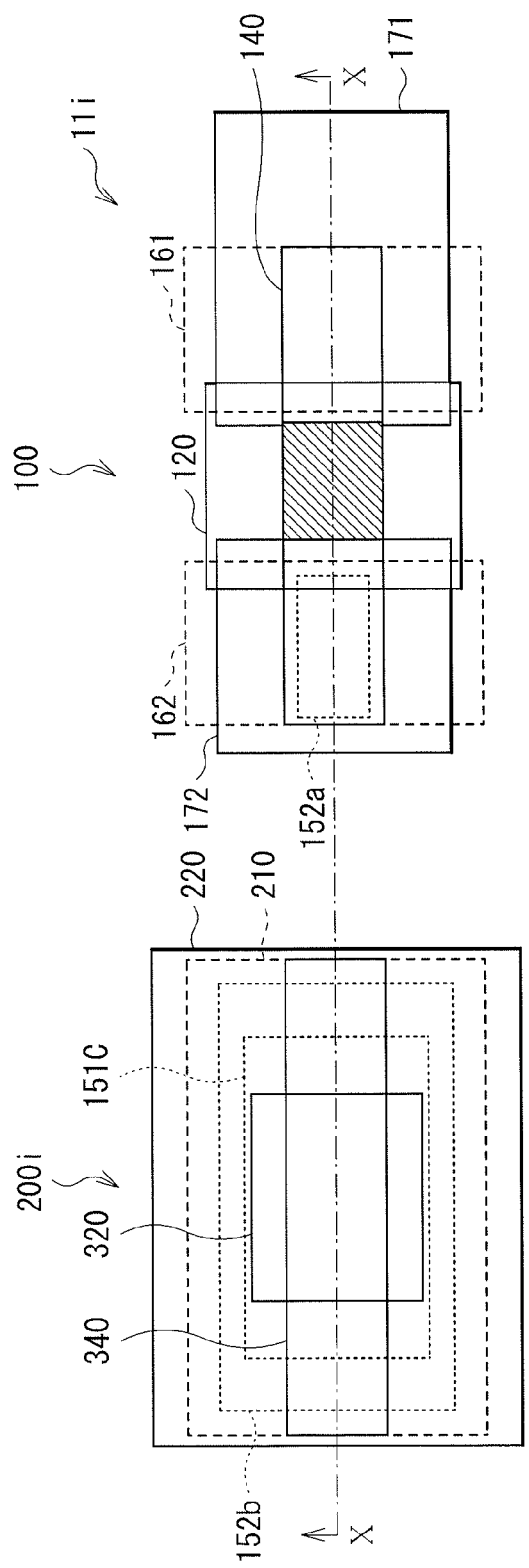
FIG. 16A is a plan view illustrating a configuration of a TFT and a capacitor according to a seventh embodiment.
Figure 16B:
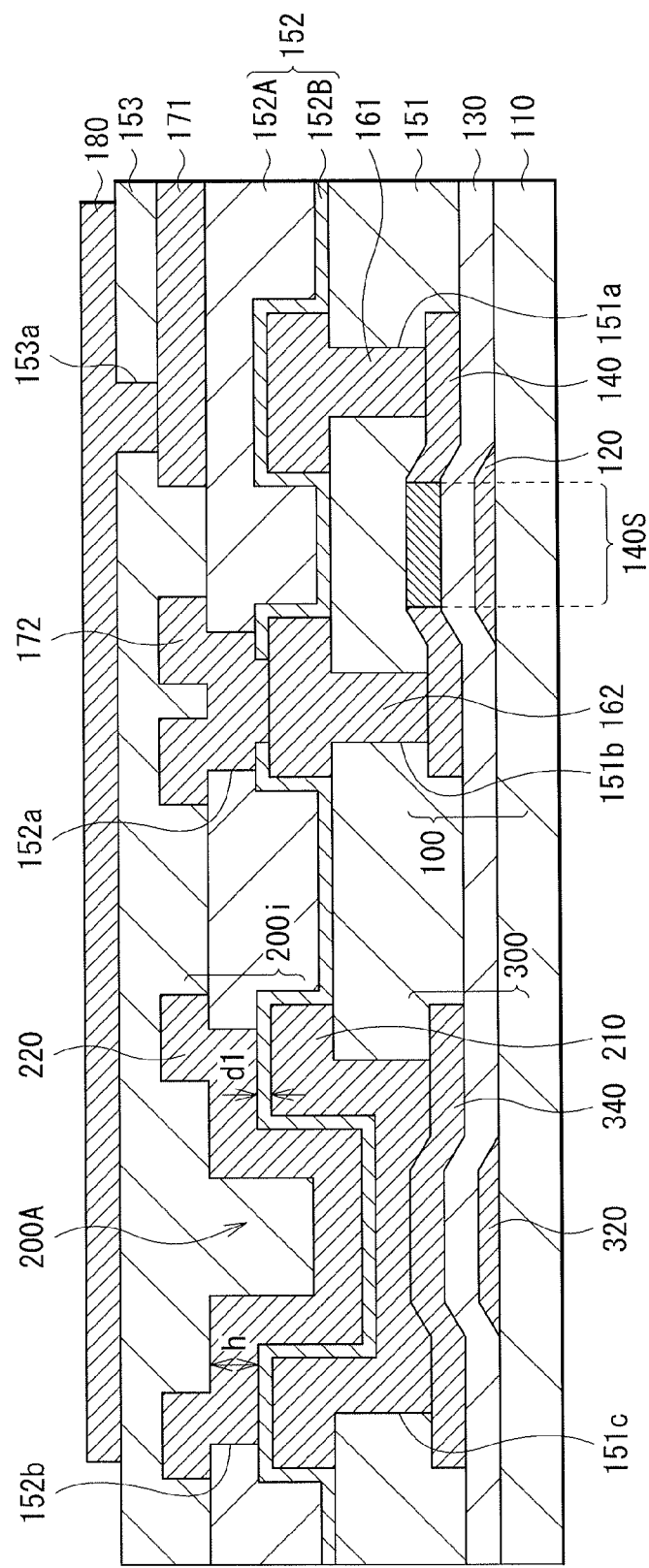
FIG. 16B is a cross-sectional view illustrating the configuration of the TFT and the capacitor illustrated in FIG. 16A.

FIG. 16A illustrates a plan configuration of the TFT 100 and a capacitor 200i of a pixel 11i that constitutes the display device 10 according to the seventh embodiment of the present technology. FIG. 16B illustrates a cross-sectional configuration along a dot dash line X-X of the pixel 11i illustrated in FIG. 16A. The pixel 11i is different from the sixth embodiment in that the recessed portion 200A is provided in an in-plane direction of the capacitor 200i (a first capacitor), and another capacitor 300 (a second capacitor) is disposed below the recessed portion 200A.

Below the capacitor 200i, similarly to the second embodiment, the capacitor 300 is disposed. The capacitor 300 is formed in the same layer as the TFT 100. In other words, the capacitor 200i and the capacitor 300 are disposed entirely or partly in an overlapped relationship on a plan view.

The capacitor 300 has a similar configuration to the second embodiment. The electrode film 320 and the semiconductor layer 340 constitute a pair of electrodes of the capacitor 300. In the present embodiment, the semiconductor layer 340 is electrically connected to the electrode film 210, which constitutes the capacitor 200i, through the contact hole 151c.

The TFT 100 and the capacitor 200i according to the present embodiment may be formed by carrying out similar processes to those of the sixth embodiment. It is to be noted that, in a process of forming the contact holes 151a, 151b, and 151c in the interlayer insulating film 151, since the semiconductor layer 340 is provided below the contact hole 151c, etching with use of, for example, a fluorine-based liquid chemical or a fluorine-based gas may be preferable.

As described above, in the pixel 11i, on the glass substrate 110, the capacitor 300 having a similar layered structure to the TFT 100 is formed. Above the capacitor 300, the capacitor 200i, which has the recessed portion 200A, is provided. In other words, the capacitor 300 and the capacitor 200i are disposed to have an overlap. Thus, in addition to effects of the above-described embodiments and the modification example, it is possible to further increase capacity per unit area.

Moreover, in the present embodiment, the metal film 210 of the capacitor 200i and the semiconductor layer 340 of the capacitor 300 are electrically connected through the contact hole 151c. This leads to reduction in area for connecting the capacitor 200i and the capacitor 300, making it possible to provide a display device having higher definition.

9. Eighth Embodiment

Figure 17A:
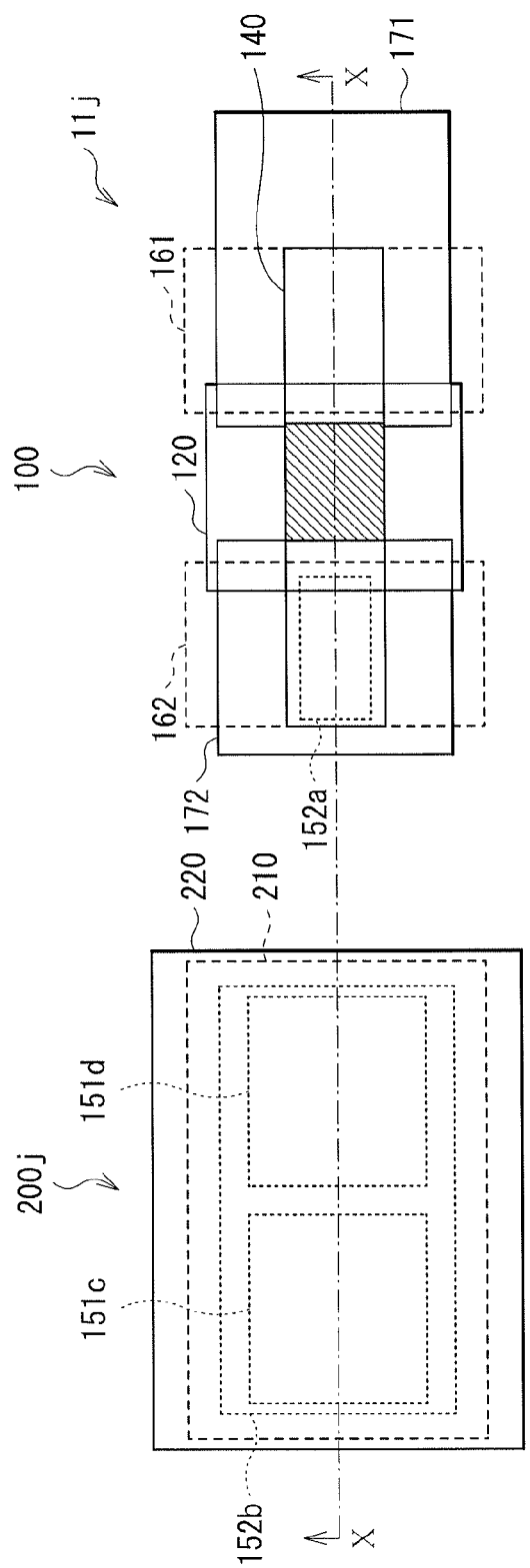
FIG. 17A is a plan view illustrating a configuration of a TFT and a capacitor according to an eighth embodiment.
Figure 17B:
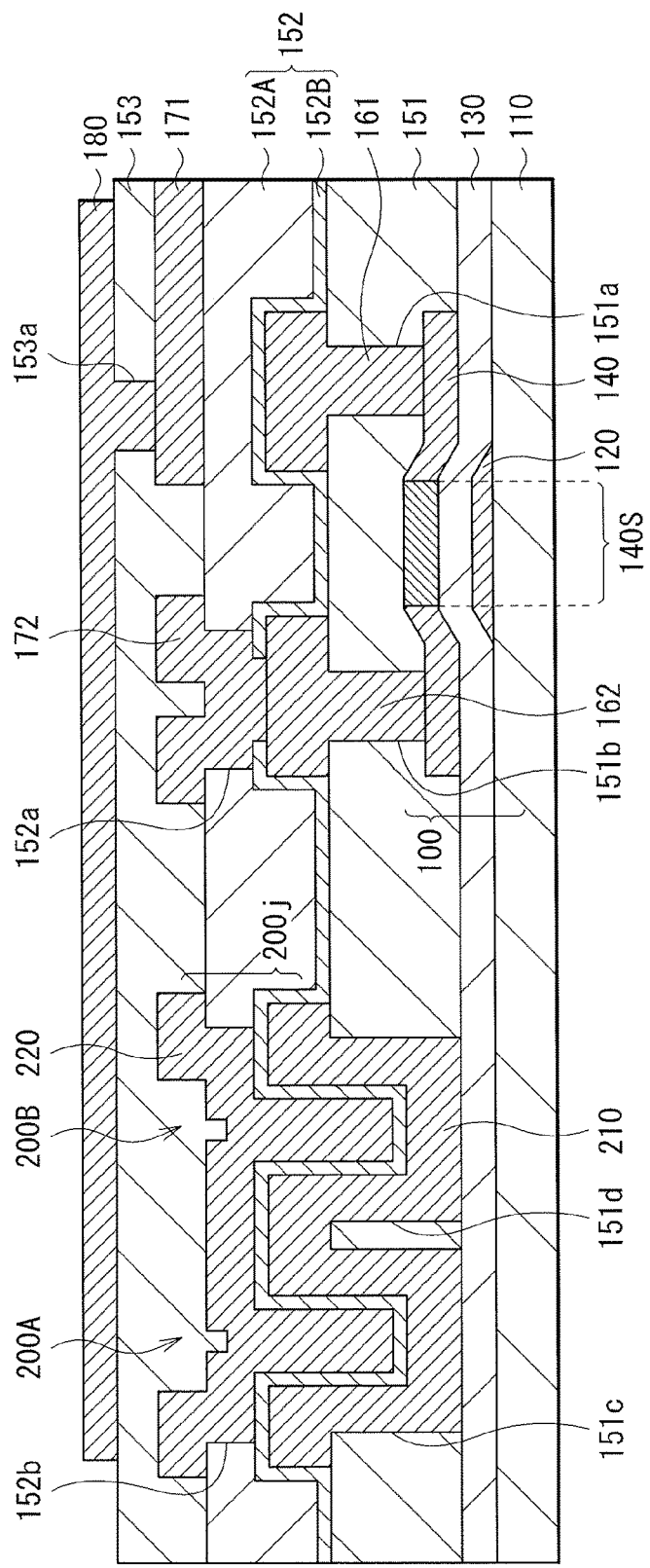
FIG. 17B is a cross-sectional view illustrating the configuration of the TFT and the capacitor illustrated in FIG. 17A.

FIG. 17A illustrates a plan configuration of the TFT 100 and a capacitor 200j of the pixel 11j that constitutes the display device 10 according to the eighth embodiment of the present technology. FIG. 17B illustrates a cross-sectional configuration along a dot dash line X-X of the pixel 11j illustrated in FIG. 17A. The pixel 11j is different from the sixth embodiment in that two recessed portions 200A and 200B are provided in an in plane direction of the capacitor 200j.

In the present embodiment, there are formed a plurality of (two, as exemplified) contact holes (contact holes 151c and 151d) that penetrate the interlayer insulating film 151 at predetermined positions. Thus, the capacitor 200j is provided with the two recessed portions 200A and 200B, as mentioned above. It is to be noted that, in FIG. 17A, the capacitor 200j and the contact holes 151c and 151d are in a fully overlapped state, but they may not be in a full inclusion relationship.

The plurality of recessed portions (the recessed portions 200A and 200B) as in the present embodiment, i.e., the contact holes (the contact holes 151c and 151d) may be formed using similar processes to those of the sixth embodiment, by forming a resist pattern at predetermined positions.

As described above, in the pixel 11j according to the present embodiment, the plurality of contact holes 151c and 151d are formed at predetermined positions of the interlayer insulating film 151, allowing the capacitor 200j to have the plurality of recessed portions 200A and 200B in the in-plane direction. Thus, it is possible to form more capacitor structures in the film thickness direction of the interlayer insulating film 151. Hence, in addition to effects of the above-described embodiments and the modification example, it is possible to obtain an effect of further increasing capacity per unit area.

It is to be noted that, as illustrated in FIG. 17B, the bottoms of the recessed portions 200A and 200B of the capacitor 200j according to the present embodiment are in contact with the gate insulating film 130, but this is not limitative. For example, similarly to the modification example 1, the contact holes 151c and 151d, which constitute the recessed portions 200A and 200B, may penetrate the gate insulating film 130 in addition to the interlayer insulating film 151, and the bottoms of the recessed portions 200A and 200B may be in contact with the glass substrate 110. Thus, it is possible to further increase capacity per unit area of the capacitor 200j.

10. Modification Example 2

Figure 18A:
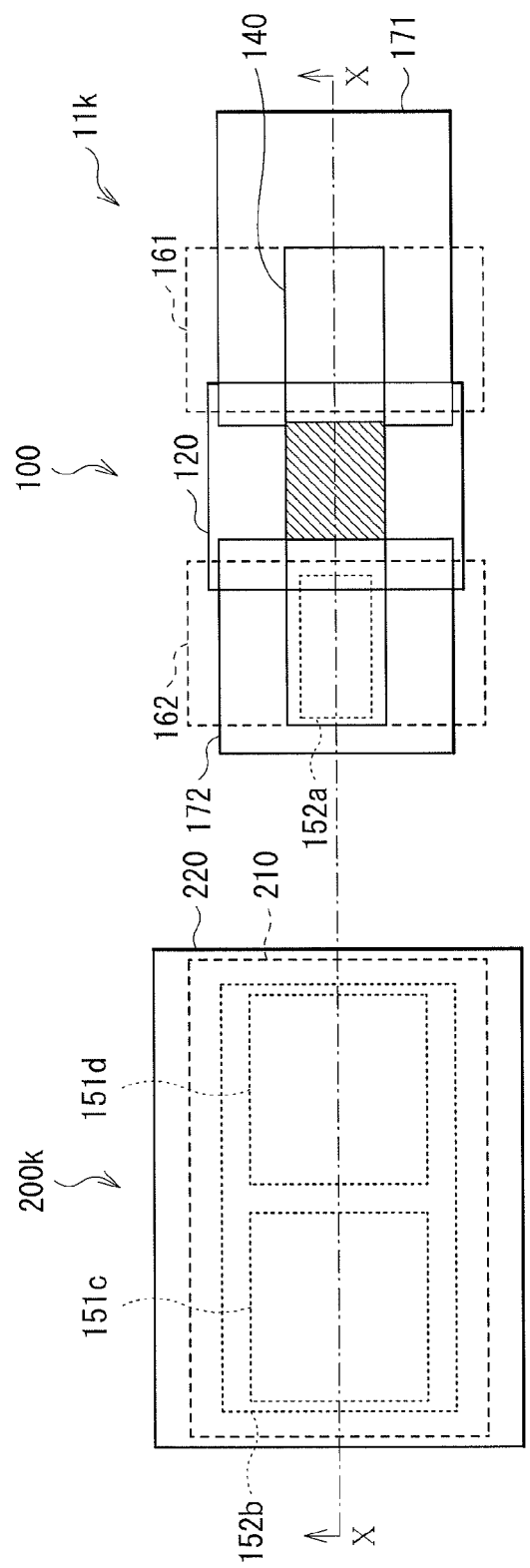
FIG. 18A is a plan view illustrating a configuration of a TFT and a capacitor according to a modification example 2.
Figure 18B:
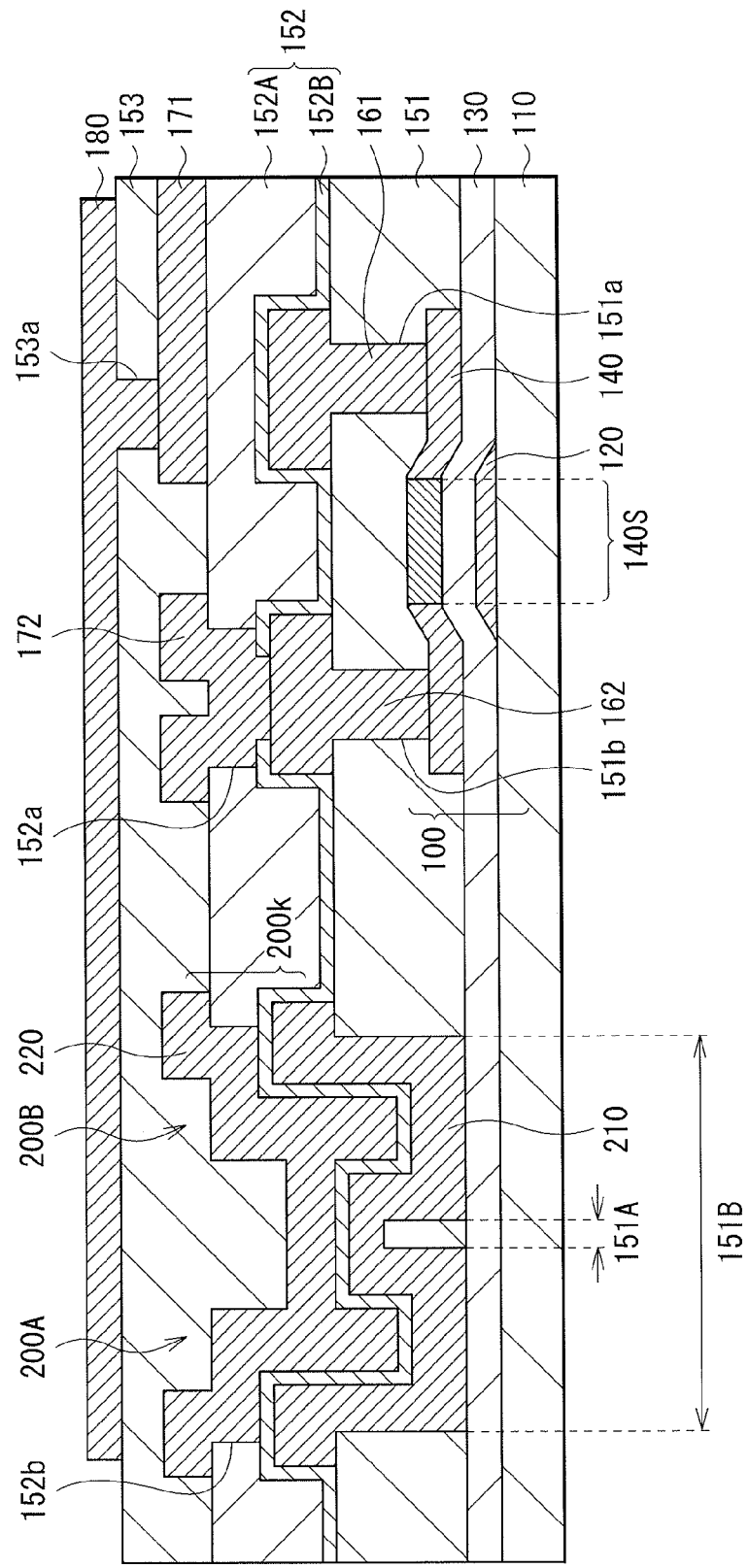
FIG. 18B is a cross-sectional view illustrating the configuration of the TFT and the capacitor illustrated in FIG. 18A.

FIG. 18A illustrates a plan configuration of a pixel 11k that includes a capacitor 200k, which is one modification example of the eighth embodiment. FIG. 18B illustrates a cross-sectional configuration along a dot dash line X-X of the pixel 11k illustrated in FIG. 18A. The present modification example is different from the above-described eighth embodiment in that the capacitor 200k includes a plurality of (two, as exemplified) recessed portions (the recessed portions 200A and 200B), and in the interlayer insulating film 151, a film thickness of an adjacent portion 151A between the adjacent recessed portions 200A and 200B is smaller than that of a portion other than the adjacent portion 151A.

The capacitor 200k according to the present modification example includes the two recessed portions 200A and 200B as mentioned above. A film thickness of the interlayer insulating film 151 that separates the recessed portions 200A and 200B, specifically, a thickness of the adjacent portion 151A is smaller than (for example, about a half of) that of a non-adjacent portion 151B. Thus, it is possible to reduce an aspect ratio of the adjacent portion 151A of the interlayer insulating film 151.

Figure 19A:
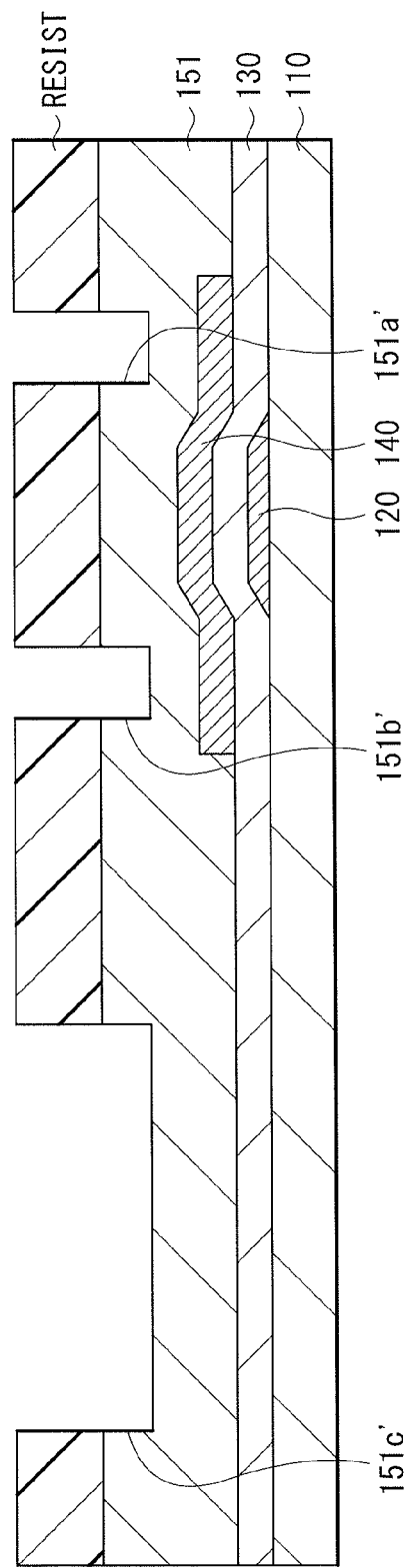
FIG. 19A is a cross-sectional view illustrating a manufacturing process of the TFT and the capacitor illustrated in FIG. 18B.
Figure 19B:
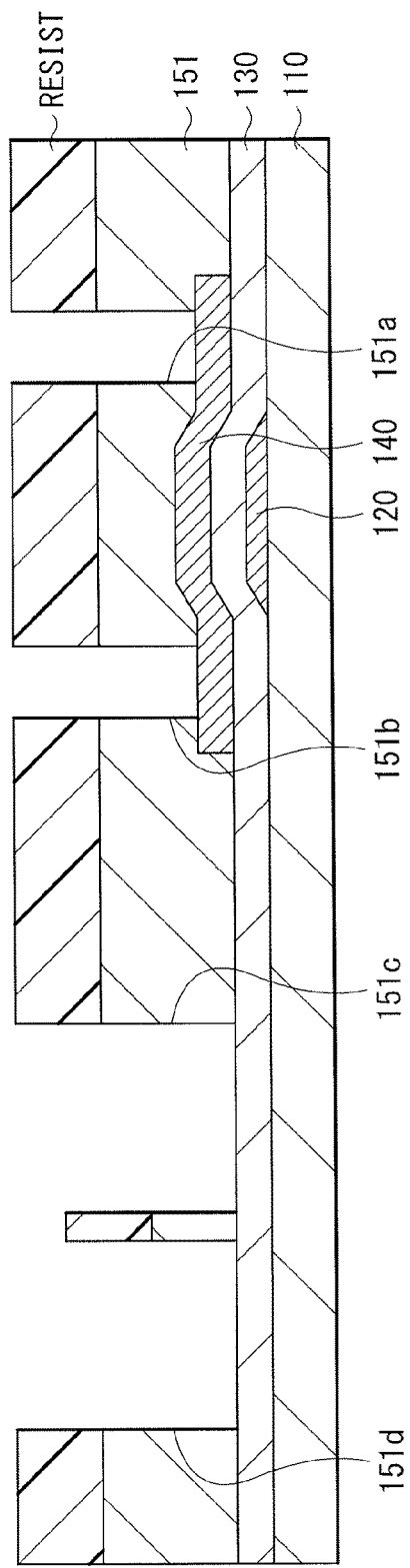
FIG. 19B is a cross-sectional view illustrating a process following FIG. 19A.

The pixel 11k may be manufactured as follows. First, as illustrated in FIG. 4A, similarly to the first embodiment, on the glass substrate 110, the gate electrode film 120, the gate insulating film 130, and the semiconductor layer 140 are formed in this order. After this, the interlayer insulating film 151 is formed. Subsequently, as illustrated in FIG. 19A, the contact holes 151a', 151b', and 151c' are formed by using, for example, a fluorine-based gas at predetermined positions of the interlayer insulating film 151, allowing the film thickness of the interlayer insulating film 151 to become a half of the original film thickness. Next, as illustrated in FIG. 19B, after forming a resist pattern in the contact hole 151c', etching is carried out again to form the contact holes 151a, 151b, 151c, and 151d. In subsequent processes, similar manufacturing processes as those of the sixth embodiment are carried out to form the pixel 11k.

It is to be noted that the contact holes 151a, 151b, 151c, and 151d are formed by two-stage etching. However, for example, they may be formed in one process by, for example, half exposure. Specifically, in forming resist patterns at positions corresponding to the contact holes 151a, 151b, 151c, and 151d, the resist patterns on the adjacent portion 151A between the contact holes 151c and 151d is formed with a smaller film thickness. Thus, it is possible to control the film thickness of the adjacent portion 151A of the interlayer insulating film 151.

As described above, in the pixel 11k according to the present modification example, in the interlayer insulating film 151, the adjacent portion 151A between the recessed portions 200A and 200B of the capacitor 200k is allowed to have a smaller film thickness. Thus, the aspect ratio of the adjacent portion 151A of the interlayer insulating film 151 is reduced, enhancing coverage property in forming the metal film 210, the high dielectric interlayer film 1528, and the metal film 220, which are formed on the interlayer insulating film 151. Accordingly, it is possible to reduce a risk of occurrence of voids, which leads to increased capacity of the capacitor 200k and reduces difficulty in manufacturing processes.

11. Application Examples

Module and Application Examples

In the following, description will be given on application examples of the display device 10 as described in the above-mentioned first to eighth embodiments and the modification examples 1 and 2. FIGS. 20 to 26B illustrate the application examples of the display device. The display device 10 according to the above-mentioned embodiments may be applied to a television set, a digital camera, a notebook personal computer, a mobile terminal device such as a mobile phone, or a video camera, or the like, i.e. an electronic apparatus in various fields that is configured to display an image or a picture based on a picture signal input from outside or a picture signal generated inside.

(Module)

Figure 20:
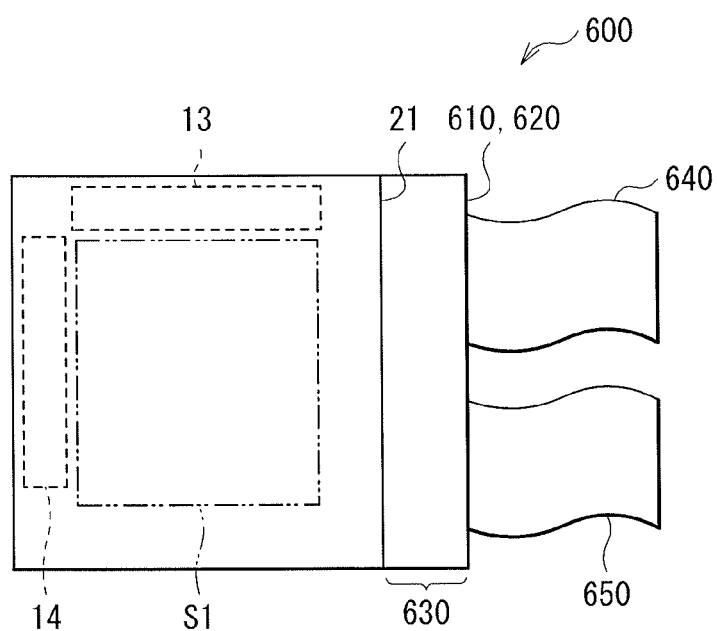
FIG. 20 is a diagram illustrating an application example of the display device according to the above-described embodiments and so forth.

The display device 10 according to the above-described embodiments and so forth is incorporated, for example, in a form of a module 600 as illustrated in FIG. 20, in various electronic apparatuses such as application examples 1 to 5, which are exemplified in the following. The module 600 includes, for example, along one side of the glass substrate 110 as illustrated in FIG. 3, a region 630 that is exposed from a protective layer 610 and a sealing substrate 620, which are laminated in this order on the pixel electrode layer 180. In the exposed region 630, provided are external connection terminals (not illustrated) that are extended from wirings of the horizontal selector 13 and the write scanner 14 that are provided in the pixel array section 12. On the external connection terminals, flexible printed circuits (FPC) 640 and 650 may be provided for signal input and output.

Modification Example 1

Figure 21A:
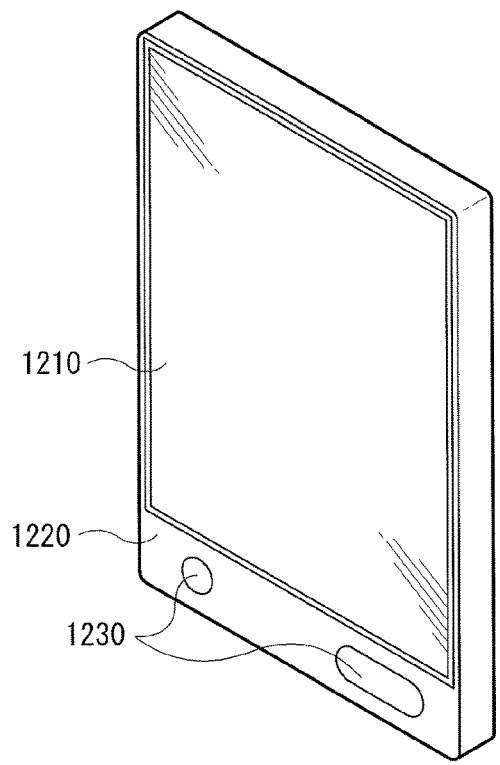
FIG. 21A is a perspective view illustrating an appearance of an application example 1 viewed from the front side.
Figure 21B:
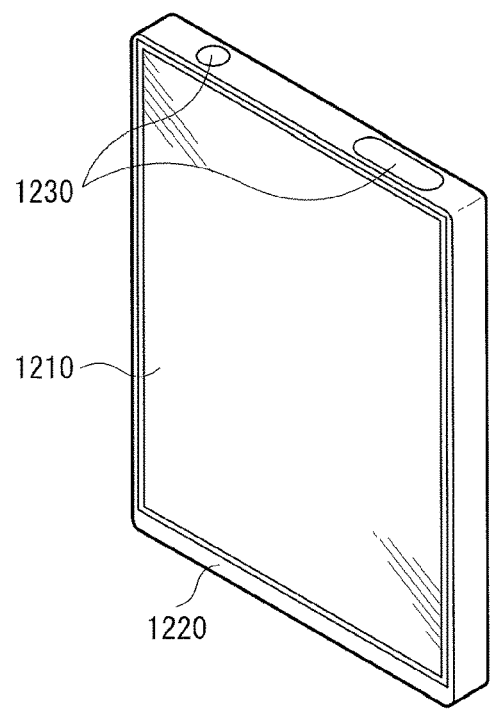
FIG. 21B is a perspective view illustrating the appearance of the application example 1 viewed from the back side.

FIG. 21 illustrates an appearance of a smart phone. The smart phone includes, for example, a display section 1210 (the display device 1) and a non-display section (a casing) 1220, and an operation section 1230. The operation section 1230 may be provided either on a front face of the non-display section 1220 as illustrated in (A) or on a top face as illustrated in (B).

Modification Example 2

Figure 22:
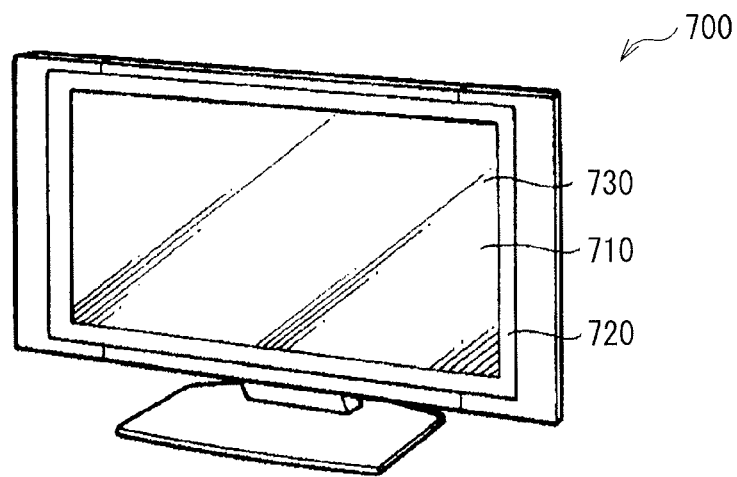
FIG. 22 is a perspective view illustrating an appearance of an application example 2.

FIG. 22 illustrates an appearance configuration of a television set. The television set 700 includes, for example, a picture display screen section 710 (the display device 1) that includes a front panel 720 and a filter glass 730.

Modification Example 3

Figure 23A:
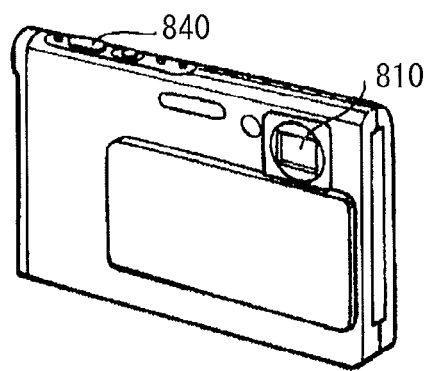
FIG. 23A is a perspective view illustrating an appearance of an application example 3 viewed from the front side.
Figure 23B:
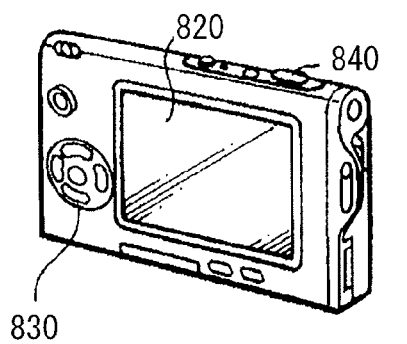
FIG. 23B is a perspective view illustrating the appearance of the application example 3 viewed from the back side.

FIGS. 23A and 23B illustrate an appearance configuration of a digital still camera 800, from the front and from the rear, respectively. The digital still camera includes, for example, a lighting section for flash lighting 810, a display section 820 (the display device 1), a menu switch 830, and a shutter button 840.

Modification Example 4

Figure 24:
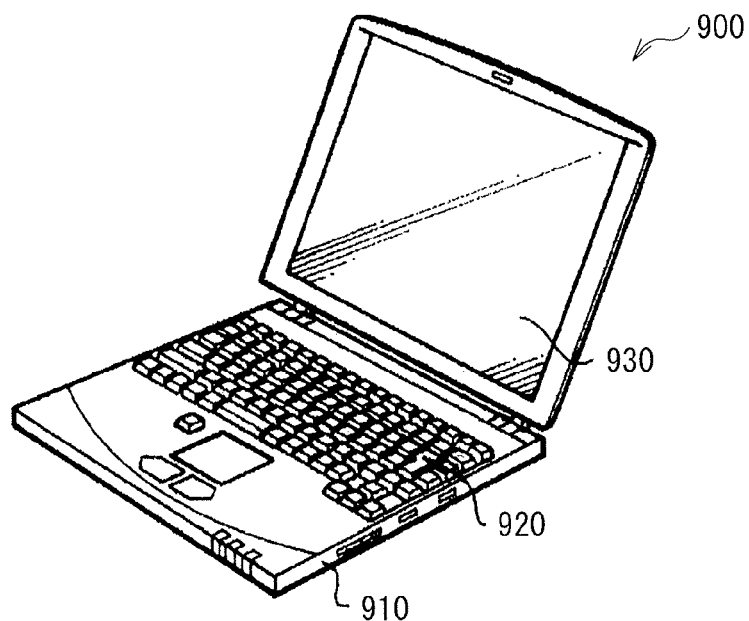
FIG. 24 is a perspective view illustrating an appearance of an application example 4.

FIG. 24 illustrates an appearance configuration of a notebook personal computer 900. The personal computer 900 includes, for example, a main body 910, a keyboard 920 for input operations of characters and the like, and a display section 930 (the display device 1) for image display.

Modification Example 5

Figure 25:
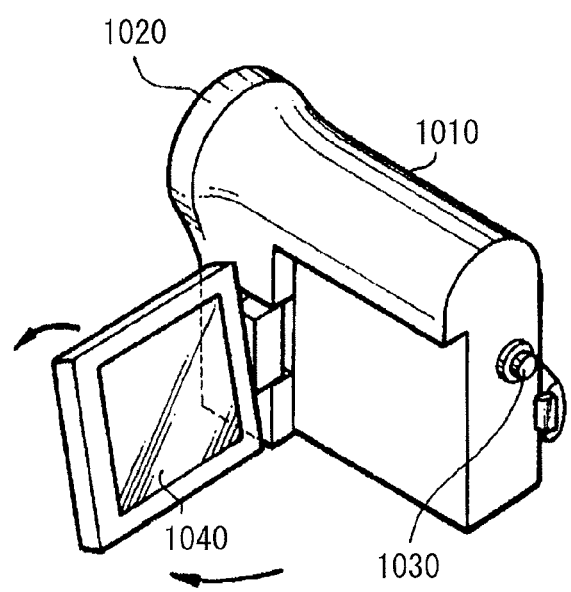
FIG. 25 is a perspective view illustrating an appearance of an application example 5.

FIG. 25 illustrates an appearance configuration of a video camera 1000. The video camera 1000 includes, for example, a main body 1010, a lens 1020 for photographing an object, which is provided on a front side face of the main body 1010, a start/stop switch 1030 in photographing, and a display section 1040 (the display device 1).

Modification Example 6

Figure 26A:
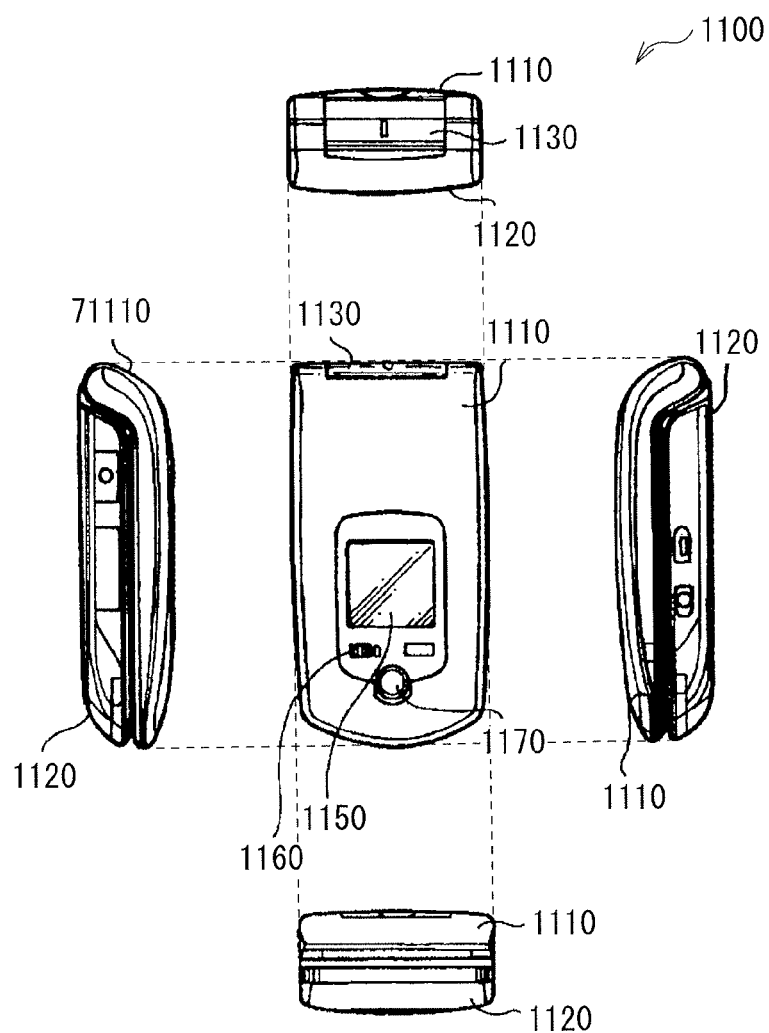
FIG. 26A is a front view, a left side view, a right side view, a top view, and a bottom view of an application example 6 in a closed state.
Figure 26B:
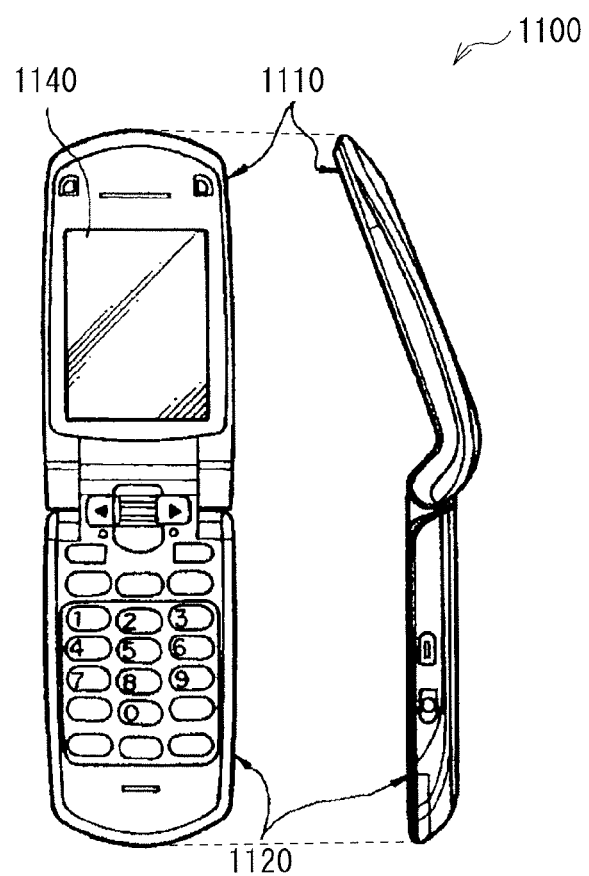
FIG. 26B is a front view and a side view of the application example 6 in an opened state.

FIGS. 26A and 26B illustrate an appearance configuration of a mobile phone 1100. FIG. 26A illustrates a front view, a left side view, a right side view, a top view, and a bottom view of the mobile phone in a closed state. FIG. 26B illustrates a front view and a side view of the mobile phone in an opened state. The mobile phone has a configuration, for example, in which an upper casing 1110 and a lower casing 1120 are linked by a connection section (a hinge section) 1120, and includes a display 1140 (the display device 1), a sub-display 1150, a picture light 1160, and a camera 1170.

Although the present technology has been described by giving the first to eighth embodiments and the modification examples 1 and 2, the present technology is not limited to the above-mentioned example embodiments and so forth, and may be modified in a variety of ways.

For example, a material and a thickness of each layer, deposition methods and deposition conditions as described in the above-mentioned example embodiments and so forth are not limited to as exemplified above, but other materials or other thicknesses, or other deposition methods or other deposition conditions may be adopted.

Moreover, in the above-described example embodiments and so forth, description has been given on specific configurations of the pixels 11, 11a to 11k. However, it is not necessary to include all the layers described above, and rather a layer or layers other than the above-mentioned layers may be also included.

It is to be noted that the present technology may have the following configurations.

(1) A display device including: a transistor section that includes a gate insulating film, a semiconductor layer, and a gate electrode layer, the semiconductor layer being laminated on the gate insulating film, the gate electrode film being laminated on an opposite side to the semiconductor layer of the gate insulating film; a first capacitor section that includes a first metal film and a second metal film, the first metal film being disposed at a same level as a wiring layer that is electrically connected to the semiconductor layer and is disposed over the transistor section, the second metal film being disposed over the first metal film with a first interlayer insulating film in between; and a display element that is configured to be controlled by the transistor section.

(2) The display device according to (1), further including a second capacitor section that is provided below the first capacitor section, wherein the second capacitor section includes an insulating film, a separate semiconductor film, and a metal film, the insulating film being disposed at a same level as the gate insulating film, the separate semiconductor film being disposed at a same level as the semiconductor layer, the metal film being disposed at a same level as the gate electrode layer.

(3) The display device according to (1) or (2), wherein the wiring layer and the first metal film are integrally formed, the wiring layer being electrically connected to the semiconductor layer.

(4) The display device according to any one of (1) to (3), wherein the first capacitor section includes at least one recessed portion in a plane of the first capacitor section.

(5) The display device according to (4), wherein a bottom of the recessed portion is in contact with the gate insulating film of the transistor section.

(6) The display device according to (4), wherein a bottom of the recessed portion is in contact with a substrate on which the transistor section is provided.

(7) The display device according to any one of (4) to (6), wherein the recessed portion is formed over the second capacitor section, and the first metal film of the first capacitor is electrically connected to one electrode film of the second capacitor section.

(8) The display device according to any one of (4) to (7), further including a second interlayer insulating film that is provided over the transistor section and includes at least one through hole, wherein the first capacitor section is provided over the second interlayer insulating film, and the recessed portion is formed in the through hole.

(9) The display device according to any one of (4) to (8), wherein the second interlayer insulating film includes two or more through holes as the through hole, and the second interlayer insulating film differs in thickness between an adjacent portion to another through hole and a non-adjacent portion.

(10) The display device according to any one of (1) to (9), wherein the first interlayer insulating film is formed over the wiring layer.

(11) The display device according to any one of (1) to (10), wherein the first interlayer insulating film is configured of any one, or any two or more of silicon oxide, silicon nitride, polyimide, and an acrylic resin.

(12) The display device according to any one of (1) to (11), wherein the first interlayer insulating film has a layered structure including at least one layer that is configured of a high dielectric constant material.

(13) The display device according to (12), wherein the high dielectric constant material is a material having a relative dielectric constant of 10 or more.

(14) A semiconductor device including: a transistor section that includes a gate insulating film, a semiconductor layer, and a gate electrode layer, the semiconductor layer being laminated on the gate insulating film, the gate electrode film being laminated on an opposite side to the semiconductor layer of the gate insulating film; and a first capacitor section that includes a first metal film and a second metal film, the first metal film being disposed at a same level as a wiring layer that is electrically connected to the semiconductor layer and is disposed over the transistor section, the second metal film being disposed over the first metal film with a first interlayer insulating film in between.

(15) The semiconductor device according to (14), further including a second capacitor section that is provided below the first capacitor section, wherein the second capacitor section includes an insulating film, a separate semiconductor film, and a metal film, the insulating film being disposed at a same level as the gate insulating film, the separate semiconductor film being disposed at a same level as the semiconductor layer, the metal film being disposed at a same level as the gate electrode layer.

(16) The semiconductor device according to (14) or (15), wherein the wiring layer and the first metal film are integrally formed, the wiring layer being electrically connected to the semiconductor layer.

(17) The semiconductor device according to any one of (14) to (16), wherein the first interlayer insulating film is formed over the wiring layer.

(18) The semiconductor device according to any one of (14) to (17), wherein the first interlayer insulating film is configured of any one, or any two or more of silicon oxide, silicon nitride, polyimide, and an acrylic resin.

(19) A method of manufacturing a display device, including: forming a transistor section by laminating a gate electrode, a gate insulating film, and a semiconductor layer; forming a first capacitor section by depositing, over the transistor section, a wiring layer and a first metal film, and by depositing, over the first metal film, a second metal film with a first interlayer insulating film in between, the wiring layer being electrically connected to the semiconductor layer, the first metal film being at a same level as the wiring layer; and forming a display element that is configured to be controlled by the transistor section.

(20) The method of manufacturing the display device according to (19), further including: depositing a second interlayer insulating film after forming the transistor section; and forming a through hole in the second interlayer insulating film.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A display device comprising, in this order:
   a substrate;
   a semiconductor film;
   a first insulating film;
   a first metal film;
   a second insulating film;
   a second metal film;
   a third insulating film;
   a third metal film;
   a fourth insulating film; and
   a pixel electrode film,
   wherein a pixel circuit region includes:
   (1) a transistor including a first portion of the semiconductor film, a first portion of the first insulating film and a first portion of the first metal film;
   (2) a first capacitor including a first portion of the second metal film, a first portion of the third insulating film and a first portion of the third metal film;
   (3) a second capacitor including a second portion of the semiconductor film, a second portion of the first insulating film and a second portion of the first metal film; and
   (4) a first wiring including a second portion of the second metal film, and the first wiring is electrically connected to the transistor,
   wherein the first capacitor overlaps with the second capacitor in a plan view, and
   wherein the pixel electrode film is disposed over the first capacitor.

2. The display device according to claim 1, wherein the third insulating film includes at least one recessed portion in cross-sectional view.

3. The display device according to claim 1,
wherein a size of the first portion of the third metal film is different from a size of the first portion of the second metal film in the plan view.

4. The display device according to claim 3, wherein the size of the first portion of the third metal film is larger than the size of the first portion of the second metal film in the plan view.

5. The display device according to claim 1, wherein the pixel electrode film is disposed over the second capacitor.

6. The display device according to claim 1, wherein the first insulating film includes at least one selected from the group consisting of silicon oxide, silicon nitride, polyimide, and an acrylic resin.

7. The display device according to claim 1, wherein the third insulating film has a layered structure.

8. The display device according to claim 1, wherein a thickness of the first portion of the third insulating film is from 50 nm to 500 nm.

9. The display device according to claim 1,
wherein a thickness of the first portion of the second metal film is from 100 nm to 1500 nm, and
wherein a thickness of the first portion of the third metal film is from 100 nm to 1500 nm.

10. The display device according to claim 1, wherein the transistor is a driving transistor.

11. The display device according to claim 1, further comprising an organic material formed on the pixel electrode film.

12. The display device according to claim 1, wherein the first wiring is electrically connected to the transistor via a first contact hole formed in the second insulating film.

13. The display device according to claim 1,
wherein the pixel circuit region further includes a second wiring that includes a second portion of the third metal film, and
wherein the pixel electrode is electrically connected to the second wiring via a second contact hole formed in the fourth insulating film.

14. The display device according to claim 1, wherein the first metal film includes molybdenum.

15. The display device according to claim 14, wherein the second metal film includes aluminum.

16. The display device according to claim 15, wherein the third metal film includes molybdenum.

17. A display device comprising, in this order:
a substrate;
a semiconductor film;
a first insulating film;
a first metal film;
a second insulating film;
a second metal film;
a third insulating film;
a third metal film;
a fourth insulating film; and
a pixel electrode film,
wherein a pixel circuit region includes:
(1) a transistor including a first portion of the semiconductor film, a first portion of the first insulating film and a first portion of the first metal film;
(2) a first capacitor including a first portion of the second metal film, a first portion of the third insulating film and a first portion of the third metal film;
(3) a second capacitor including a second portion of the semiconductor film, a second portion of the first insulating film and a second portion of the first metal film; and
(4) a light emitting element including the pixel electrode film,
wherein the light emitting element is configured to be controlled by the transistor, and
wherein the first capacitor overlaps with the second capacitor in a plan view.

18. The display device according to claim 17,
wherein the pixel circuit region further includes a first wiring that includes a second portion of the second metal film, and
wherein the first wiring is electrically connected to the transistor.

19. The display device according to claim 18, wherein the first wiring is electrically connected to the transistor via a first contact hole formed in the second insulating film.

20. The display device according to claim 18,
wherein the pixel circuit region further includes a second wiring that includes a second portion of the third metal film, and
wherein the pixel electrode is electrically connected to the second wiring via a second contact hole formed in the fourth insulating film.

21. The display device according to claim 17, wherein the third insulating film includes at least one recessed portion in cross-sectional view.

22. The display device according to claim 17,
wherein a size of the first portion of the third metal film is different from a size of the first portion of the second metal film in the plan view.

23. The display device according to claim 22, wherein the size of the first portion of the third metal film is larger than the size of the first portion of the second metal film in the plan view.

24. The display device according to claim 17, wherein the pixel electrode film is disposed over the second capacitor.

25. The display device according to claim 17, wherein the first insulating film includes at least one selected from the group consisting of silicon oxide, silicon nitride, polyimide, and an acrylic resin.

26. The display device according to claim 17, wherein the third insulating film has a layered structure.

27. The display device according to claim 17, wherein a thickness of the first portion of the third insulating film is from 50 nm to 500 nm.

28. The display device according to claim 17,
wherein a thickness of the first portion of the second metal film is from 100 nm to 1500 nm, and
wherein a thickness of the first portion of the third metal film is from 100 nm to 1500 nm.

29. The display device according to claim 17, wherein the transistor is a driving transistor.

30. The display device according to claim 17, wherein the first metal film includes molybdenum.

31. The display device according to claim 30, wherein the second metal film includes aluminum.

32. The display device according to claim 31, wherein the third metal film includes molybdenum.

33. The display device according to claim 17, wherein the light emitting element is an organic EL device.

34. The display device according to claim 17, wherein the light emitting element includes a light emission layer including an organic material, and formed on the pixel electrode film.

* * * * *